United States Patent
Kuwahara et al.

(10) Patent No.: US 11,075,101 B2
(45) Date of Patent: Jul. 27, 2021

(54) INDEXER APPARATUS, SUBSTRATE TREATING APPARATUS, METHOD FOR CONTROLLING INDEXER APPARATUS, AND METHOD FOR CONTROLLING SUBSTRATE TREATING APPARATUS

(71) Applicant: SCREEN Holdings Co., Ltd., Kyoto (JP)

(72) Inventors: Joji Kuwahara, Kyoto (JP); Seiji Murai, Kyoto (JP)

(73) Assignee: SCREEN Holdings Co., Ltd.

( * ) Notice: Subject to any disclaimer, the term of this patent is extended or adjusted under 35 U.S.C. 154(b) by 52 days.

(21) Appl. No.: 16/556,293

(22) Filed: Aug. 30, 2019

(65) Prior Publication Data
US 2020/0098612 A1 Mar. 26, 2020

(30) Foreign Application Priority Data
Sep. 21, 2018 (JP) .............................. JP2018-178015

(51) Int. Cl.
*H01L 21/677* (2006.01)

(52) U.S. Cl.
CPC .. *H01L 21/67775* (2013.01); *H01L 21/67766* (2013.01); *H01L 21/67769* (2013.01)

(58) Field of Classification Search
CPC ......... H01L 21/67775; H01L 21/67766; H01L 21/67769; H01L 21/67778; H01L 21/67184; H01L 21/67781; H01L 21/67742; H01L 21/67745; H01L 21/67748; H01L 21/67178
See application file for complete search history.

(56) References Cited

U.S. PATENT DOCUMENTS

| 5,944,894 | A | * | 8/1999 | Kitano | .................... F24F 3/161 118/326 |
| 8,480,319 | B2 | * | 7/2013 | Hayashi | .................. G03F 7/162 396/611 |
| 2001/0038783 | A1 | | 11/2001 | Nakashima et al. | .......... 414/217 |
| 2010/0129182 | A1 | * | 5/2010 | Ishida | ............... H01L 21/67769 414/222.1 |

(Continued)

FOREIGN PATENT DOCUMENTS

| JP | 2010-171314 A | 8/2010 |
| JP | 2012-209288 A | 10/2012 |

(Continued)

OTHER PUBLICATIONS

Office Action dated Sep. 9, 2020 for corresponding Taiwan Patent Application No. 108130572.

*Primary Examiner* — Glenn F Myers
(74) *Attorney, Agent, or Firm* — Ostrolenk Faber LLP

(57) ABSTRACT

Each of first and second substrate transportation mechanisms transports a substrate for a FOUP placed not on, for example, each of two openers disposed laterally but on, for example, each of two openers disposed in an upward/downward direction. Thus, even if the number of openers increases, the substrate is transported not by sliding a hand capable of moving forward and backward, but by lifting, lowering, and rotating the hand. Thus, transportation of the substrate can be simplified. Accordingly, standby time of substrate transportation can be reduced, and a decrease in substrate transportation efficiency can be prevented.

13 Claims, 17 Drawing Sheets

(56) References Cited

U.S. PATENT DOCUMENTS

| | | | |
|---|---|---|---|
| 2010/0228378 A1 | 9/2010 | Fukutomi et al. | 700/112 |
| 2012/0084059 A1* | 4/2012 | Akada | H01L 21/67225 |
| | | | 702/188 |
| 2012/0249990 A1 | 10/2012 | Nishimura et al. | 355/72 |
| 2013/0078059 A1* | 3/2013 | Enokida | H01L 21/67769 |
| | | | 414/222.13 |
| 2013/0236838 A1* | 9/2013 | Matsuyama | H01L 21/67745 |
| | | | 430/325 |
| 2013/0272824 A1* | 10/2013 | Iida | H01L 21/67772 |
| | | | 414/222.01 |
| 2014/0255863 A1* | 9/2014 | Abe | H01L 21/67742 |
| | | | 432/239 |
| 2014/0286733 A1 | 9/2014 | Ogura et al. | 414/217.1 |

FOREIGN PATENT DOCUMENTS

| | | |
|---|---|---|
| JP | 2013-157650 A | 8/2013 |
| WO | WO 2013/069716 A1 | 5/2013 |

* cited by examiner

Fig. 12

OPERATION PRIORITY ORDER OF FOUP BUFFER DEVICE

| PRIORITY 1 | RETURN | TRANSPORT TREATED SUBSTRATE FOUP FROM OPENER TO OUTPUT PORT |
| --- | --- | --- |
| | | TRANSPORT TREATED SUBSTRATE FOUP FROM TREATED SUBSTRATE FOUP SHELF TO OUTPUT PORT |
| PRIORITY 2 | RETURN | TRANSPORT TREATED SUBSTRATE FOUP FROM OPENER TO TREATED SUBSTRATE FOUP SHELF |
| PRIORITY 3 | RETURN | TRANSPORT EMPTY FOUP FROM EMPTY FOUP SHELF TO OPENER |
| PRIORITY 4 | | TRANSPORT EMPTY FOUP FROM OPENER TO EMPTY FOUP SHELF |
| PRIORITY 5 | SEND | TRANSPORT UNTREATED SUBSTRATE FOUP FROM INPUT PORT TO OPENER |
| | SEND | TRANSPORT UNTREATED SUBSTRATE FOUP FROM UNTREATED SUBSTRATE FOUP SHELF TO OPENER |
| PRIORITY 6 | SEND | TRANSPORT UNTREATED SUBSTRATE FOUP FROM INPUT PORT TO UNTREATED SUBSTRATE FOUP SHELF |

INDEXER APPARATUS, SUBSTRATE TREATING APPARATUS, METHOD FOR CONTROLLING INDEXER APPARATUS, AND METHOD FOR CONTROLLING SUBSTRATE TREATING APPARATUS

CROSS-REFERENCE TO RELATED APPLICATIONS

This application claims priority to Japanese Patent Application No. 2018-178015 filed Sep. 21, 2018, the subject matter of which is incorporated herein by reference in entirety.

BACKGROUND OF THE INVENTION

Technical Field

The present invention relates to an indexer apparatus including a carrier platform on which a carrier capable of accommodating a plurality of substrates is placed and which is configured to transport substrates accommodate in the carrier, and also relates to a substrate treating apparatus, a method of controlling the indexer apparatus, and a method of controlling the substrate treating apparatus. Examples of substrates include semiconductor substrates, substrates for flat panel displays (FPDs), glass substrates for photomasks, substrates for optical disks, substrates for magnetic disks, ceramic substrates, and substrates for solar cells. Examples of the FPDs include liquid crystal display devices and organic electroluminescence (EL) display devices.

Description of the Related Art

A currently-used substrate treating apparatus includes an indexer block (indexer apparatus) and a treating block (e.g., Japanese Unexamined Patent Application Publication No. 2012-209288). In a case where the treating block is coupled to a rear surface of the indexer block, two openers are disposed side by side horizontally in an outer wall at the front of the indexer block. A substrate buffer unit on which a plurality of substrates can be placed in an upward/downward direction (vertical direction) is disposed between the indexer block and the treating block.

Two substrate transportation mechanisms are disposed inside the indexer block. A first substrate transportation mechanism is configured to transport substrates between a front opening unified pod (FOUP) placed on a first opener and the substrate buffer unit. A second substrate transportation mechanism is configured to transport substrates between a FOUP placed on a second opener and the substrate buffer unit. That is, the first substrate transportation mechanism transports the substrates for the first opener, and the second substrate transportation mechanism transports the substrates for the second opener. Accordingly, the substrates can be efficiently taken from the FOUPs, and can be efficiently accommodated in the FOUPs.

The substrate treating apparatus further includes a FOUP buffer device (stocker device). The FOUP buffer device is disposed to face the two openers. The FOUP buffer device includes a shelf on which a FOUP is placed for keeping the FOUP and a FOUP transportation mechanism for transporting the FOUP between the shelf and two openers (see, for example, Japanese Patent Unexamined Application Publications Nos. 2012-209288, 2013-157650, and 2010-171314). Japanese Unexamined Patent Application Publication No. 2013-157650 discloses a FOUP transportation mechanism including two grippers and an exchanging operation (replacing operation) of FOUPs with the two grippers.

Japanese Unexamined Patent Application Publication No. 2012-209288 and International Patent Publication No. WO2013/069716 disclose a plurality of openers arranged in the upward/downward direction.

SUMMARY

The currently-used device having such a configuration has the following problems. As described above, the first substrate transportation mechanism transports substrates for the first opener, and the second substrate transportation mechanism transports substrates for the second opener. For example, once all the substrates have been taken from a FOUP placed on the first opener, the first substrate transportation mechanism is brought into a standby state where no transportation is performed. From the viewpoint of enhancing throughput of the substrate treating apparatus, this standby state is desirably reduced. In a conceivable configuration for reducing the standby state, two openers are added so that four openers in total are arranged horizontally. However, if two substrate transportation mechanisms are respectively associated with the two openers arranged horizontally, each of the substrate transportation mechanisms needs to be moved in the rightward/leftward direction, for example. Accordingly, although the standby state can be reduced, the movement in the rightward/leftward direction might reduce efficiency in transporting substrates (e.g., the time from taking of the substrates from the FOUP to placing the substrates on the substrate buffer).

It is therefore an object of the present invention to provide an indexer apparatus capable of reducing a standby state of a substrate transportation mechanism and of preventing a decrease in substrate transportation efficiency, a substrate treating apparatus, a method for controlling the indexer apparatus, and a method for controlling the substrate treating apparatus.

Solution to Problem

To achieve the object, the present invention provides a configuration as follows. Specifically, the present invention provides an indexer apparatus that sends and receives substrates to/from carriers each capable of accommodating a plurality of substrates. The indexer apparatus includes a first carrier platform line including two or more carrier platforms arranged in an upward/downward direction; a second carrier platform line including two or more carrier platforms arranged in the upward/downward direction, the second carrier platform line being disposed at a side of the first carrier platform line in a horizontal direction; a substrate buffer unit on which a plurality of substrates are placed; a first substrate transportation mechanism that transports a substrate between the substrate buffer unit and the carrier placed on each of the two or more carrier platforms in the first carrier platform line; and a second substrate transportation mechanism that transports a substrate between the substrate buffer unit and the carrier placed on each of the two or more carrier platforms in the second carrier platform line, each of the first substrate transportation mechanism and the second substrate transportation mechanism including a hand capable of moving forward and backward in the horizontal direction and configured to hold a substrate, and a lifting/lowering rotation driving unit that lifts and lowers the hand along a strut portion extending in the upward/downward direction and that rotates the hand about an axis extending along the strut portion, and a position of the lifting/lowering rotation driving unit in the horizontal direction being fixed.

In the indexer apparatus according to the present invention, each of the first substrate transportation mechanism and the second substrate transportation mechanism transports substrates for carriers each placed not on two or more carrier platforms arranged laterally but on two or more carrier platforms arranged in the upward/downward direction. Thus, even if the number of carrier platforms increases, the substrate is transported not by laterally sliding a hand capable of moving forward and backward, but by lifting, lowering, and rotating the hand. Thus, transportation of the substrate can be simplified. Accordingly, standby time of substrate transportation can be reduced, and a decrease in substrate transportation efficiency can be prevented.

Preferably, in the indexer apparatus described above, after the first substrate transportation mechanism transports every substrate on the carrier placed on a predetermined carrier platform in the first carrier platform line, the first substrate transportation mechanism transports a substrate on another carrier in the first carrier platform line, and after the second substrate transportation mechanism transports every substrate on the carrier placed on a predetermined carrier platform in the second carrier platform line, the second substrate transportation mechanism transports a substrate on another carrier in the second carrier platform line.

With this configuration, after having transported all the substrates are transported for a carrier, each of the first substrate transportation mechanism and the second substrate transportation mechanism can transport substrates for another carrier.

One aspect of the present invention provides a substrate treating apparatus for performing treatment on a substrate. The substrate treating apparatus includes an indexer block that sends and receives substrate to/from carriers each capable of accommodating a plurality of substrates; and a treating block that performs a predetermined treatment on a substrate, the indexer block including a first carrier platform line including two or more carrier platforms arranged in a upward/downward direction, a second carrier platform line including two or more carrier platforms arranged in the upward/downward direction, the second carrier platform line being disposed at a side of the first carrier platform line in a horizontal direction, a substrate buffer unit disposed between the indexer block and the treating block, a plurality of substrates being disposed on the substrate buffer, a first substrate transportation mechanism that transports a substrate between the substrate buffer unit and the carrier placed on each of the two or more carrier platforms in the first carrier platform line, and a second substrate transportation mechanism that transports a substrate between the substrate buffer unit and the carrier placed on each of the two or more carrier platforms in the second carrier platform line, each of the first substrate transportation mechanism and the second substrate transportation mechanism including a hand capable of moving forward and backward in the horizontal direction and configured to hold a substrate, and a lifting/lowering rotation driving unit that lifts and lowers the hand along a strut portion extending in the upward/downward direction and that rotates the hand about an axis extending along the strut portion, and a position of the lifting/lowering rotation driving unit in the horizontal direction being fixed.

In the substrate treating apparatus according to the present invention, each of the first substrate transportation mechanism and the second substrate transportation mechanism transports substrates for carriers each placed not on two or more carrier platforms arranged laterally but on two or more carrier platforms arranged in the upward/downward direction. Thus, even if the number of carrier platforms increases, the substrate is transported not by laterally sliding a hand capable of moving forward and backward, but by lifting, lowering, and rotating the hand. Thus, transportation of the substrate can be simplified. Accordingly, standby time of substrate transportation can be reduced, and a decrease in substrate transportation efficiency can be prevented.

Moreover, in the substrate treating apparatus described above, after the first substrate transportation mechanism takes every substrate from the carrier placed on a predetermined carrier platform in the first carrier platform line, the first substrate transportation mechanism takes a substrate from another carrier in the first carrier platform line, and after the second substrate transportation mechanism accommodates every substrate in the carrier placed on a predetermined carrier platform in the second carrier platform line, the second substrate transportation mechanism accommodates a substrate in another carrier in the second carrier platform line. Such is preferable.

With this configuration, after having taken all the substrate from the carrier, the first substrate transportation mechanism can take a substrate from another carrier. The second substrate transportation mechanism can accommodate all the substrates in the carrier and then accommodate a substrate in another carrier.

Moreover, the substrate treating apparatus described above further includes a carrier transportation mechanism disposed at a side opposite to the first substrate transportation mechanism and the second substrate transportation mechanism with the first carrier platform line and the second carrier platform line interposed therebetween, the carrier transportation mechanism being configured to transport the carrier. The carrier transportation mechanism replaces a carrier from which every substrate has been taken by the first substrate transportation mechanism, by another carrier accommodating a substrate, and replaces a carrier caused to accommodate every substrate by the second substrate transportation mechanism, by another carrier accommodating no substrates. Such is preferable.

If a plurality of carrier platforms is arranged in the upward/downward direction, a hand of an operator cannot reach an upper carrier platform, for example, and thus, it can be difficult for the operator to replace carriers for the upper carrier platform in some cases. In this configuration, however, since the carrier transportation mechanism transports the carrier, transportation of the carrier can be made easily. In addition, a carrier from which all the substrates are taken out is replaced by another carrier accommodating substrates, and thus, a larger number of untreated substrates can be supplied to the substrate treating apparatus. Furthermore, the carrier accommodating all the substrates is replaced by another carrier accommodating no substrates, and thus, a large number of treated substrates after a treatment by a treating block can be returned to the carrier.

Moreover, the substrate treating apparatus described above further includes an empty carrier shelf on which a carrier accommodating no substrates is allowed to be placed. In a case where the carrier is not placed on any of the two or more carrier platforms in the first carrier platform line, a case where the carrier is not placed on at least one of the two or more carrier platforms in the second carrier platform line, and a case where the carrier is not placed on the empty carrier shelf, the carrier transportation mechanism transports a specific carrier to one of the carrier platforms on which the carrier is not placed in the second carrier platform line, the second substrate transportation mechanism takes a substrate from the specific carrier and then accommodates a treated substrate treated in the treating block in the specific carrier, and the carrier transportation mechanism leaves the specific carrier at a placement position of the specific carrier from when every substrate is taken from the specific carrier by the second substrate transportation mechanism to when every treated substrate is accommodated in the specific carrier. Such is preferable.

In general, the second substrate transportation mechanism is set to accommodate (return) substrates to carriers in the second carrier platform line. However, if a predetermined condition is satisfied, the second substrate transportation mechanism takes substrates from a specific carrier and accommodates treated substrates in the specific carrier. That is, the second substrate transportation mechanism performs an operation different from an ordinary substrate transportation. Accordingly, the specific carrier can remain at a placement position from when all the substrates are taken from the specific carrier to when all the substrates are accommodated. Thus, the carrier transportation mechanism can transport carriers except for the specific carrier, and thus, efficiency in transporting carriers can be increased. As a result, standby time for carrier transportation can be reduced so that throughput of substrate treatment can be enhanced.

Moreover, in the substrate treating apparatus described above, the first substrate transportation mechanism, the second substrate transportation mechanism, and the third substrate transportation mechanism of the treating block perform substrate transportation while causing hands of the first substrate transportation mechanism, the second substrate transportation mechanism, and the third substrate transportation mechanism to enter the substrate buffer unit simultaneously. Such is preferable. In the substrate transportation of each of the first substrate transportation mechanism, the second substrate transportation mechanism, and the third substrate transportation mechanism of the treating block, hands of the first substrate transportation mechanism, the second substrate transportation mechanism, and the third substrate transportation mechanism at the same time to place substrates and receive substrates. With this configuration, it is unnecessary to wait for a time in which other hands enter the substrate buffer unit and move backward, and thus, transportation efficiency of substrates can be enhanced. As a result, a throughput of substrate treatment can be enhanced.

As an example of the substrate treating apparatus, the treating block includes a plurality of treatment layers arranged in the upward/downward direction, each of the plurality of treatment layers includes a third substrate transportation mechanism for transporting a substrate, a transportation space extending linearly in the horizontal direction such that the third substrate transportation mechanism moves in the transportation space, a plurality of liquid treatment units extending along the transportation space, the plurality of liquid treatment units being arranged horizontally with respect to the transportation space and being configured to treat a substrate by supplying a treatment solution, and the plurality of liquid treatment units are not overlaid on each other in a plurality of levels but are arranged in one level.

In each treatment layer, since liquid treatment units are not overlaid on one another in a plurality of levels but are arranged in a single level so that the height of the treatment layer is reduced and, accordingly, the height of the treating block can be reduced.

Another aspect of the present invention provides a method for controlling an indexer apparatus including a substrate buffer unit on which a plurality of substrates is placed, a first substrate transportation mechanism, and a second substrate transportation mechanism, the indexer apparatus is configured to send and receive a substrate to/from carriers each capable of accommodating a plurality of substrates. The method includes a first substrate transportation step of transporting a substrate by the first substrate transportation mechanism between the substrate buffer unit and the carrier placed on each of two or more carrier platforms included in a first carrier platform line and arranged in a upward/downward direction; and a second substrate transportation step of transporting a substrate by the second substrate transportation mechanism between the substrate buffer unit and the carrier placed on each of two or more carrier platforms included in a second carrier platform line and arranged in the upward/downward direction, the second carrier platform line being disposed at a side of the first carrier platform line in a horizontal direction, and in the first substrate transportation step and the second substrate transportation step, each of the first substrate transportation mechanism and the second substrate transportation mechanism transporting a substrate with a position of a lifting/lowering rotation driving unit in the horizontal direction being fixed, by using a hand capable of moving forward and backward in the horizontal direction and the lifting/lowering rotation driving unit configured to lift and lower the hand along a strut portion extending in the upward/downward direction and to rotate the hand about an axis along the strut portion.

In the method for controlling an indexer apparatus according to the present invention, each of the first substrate transportation mechanism and the second substrate transportation mechanism transports substrates for carriers each placed not on two or more carrier platforms arranged laterally but on two or more carrier platforms arranged in the upward/downward direction. Thus, even if the number of carrier platforms increases, the substrate is transported not by laterally sliding a hand capable of moving forward and backward, but by lifting, lowering, and rotating the hand. Thus, transportation of the substrate can be simplified. Accordingly, standby time of substrate transportation can be reduced, and a decrease in substrate transportation efficiency can be prevented.

Another aspect of the present invention provides a method for controlling a substrate treating apparatus including a treating block that performs a predetermined treatment on a substrate, and an indexer block that sends and receives a substrate to/from carriers each capable of accommodating a plurality of substrates, the indexer block including a first substrate transportation mechanism, a second substrate transportation mechanism, and a substrate buffer block, the substrate buffer block being used for transporting a substrate between the indexer block and the treating block, a plurality of substrates are placed on the substrate buffer unit. The method includes a first substrate transportation step of transporting a substrate by the first substrate transportation mechanism between the substrate buffer unit and the carrier placed on each of two or more carrier platforms included in a first carrier platform line and arranged in a upward/downward direction; and a second substrate transportation step of transporting a substrate by the second substrate transportation mechanism between the substrate buffer unit and the carrier placed on each of two or more carrier platforms included in a second carrier platform line and arranged in the upward/downward direction, the second carrier platform line being disposed at a side of the first carrier platform line in a horizontal direction, and in the first substrate transportation step and the second substrate transportation step, each of the first substrate transportation mechanism and the second substrate transportation mechanism transporting a substrate with a position of a lifting/lowering rotation driving unit in the horizontal direction being fixed, by using a hand capable of moving forward and backward in the horizontal direction and the lifting/lowering rotation driving unit configured to lift and lower the hand along a strut portion extending in the upward/downward direction and to rotate the hand about an axis along the strut portion.

In the method for controlling the substrate treating apparatus according to the present invention, each of the first substrate transportation mechanism and the second substrate transportation mechanism transports substrates for carriers each placed not on two or more carrier platforms arranged laterally but on two or more carrier platforms arranged in the upward/downward direction. Thus, even if the number of carrier platforms increases, the substrate is transported not by laterally sliding a hand capable of moving forward and backward, but by lifting, lowering, and rotating the hand. Thus, transportation of the substrate can be simplified. Accordingly, standby time of substrate transportation can be reduced, and a decrease in substrate transportation efficiency can be prevented.

Advantageous Effects of Invention

In the indexer apparatus, the substrate treating apparatus, the method for controlling an indexer apparatus, and a method for controlling a substrate treating apparatus according to the present invention, a standby state of a substrate transportation mechanism can be reduced, and a decrease in substrate transportation efficiency can be prevented.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 12 is a table showing an operation priority order of the FOUP buffer device.

EMBODIMENTS

Figure 1:
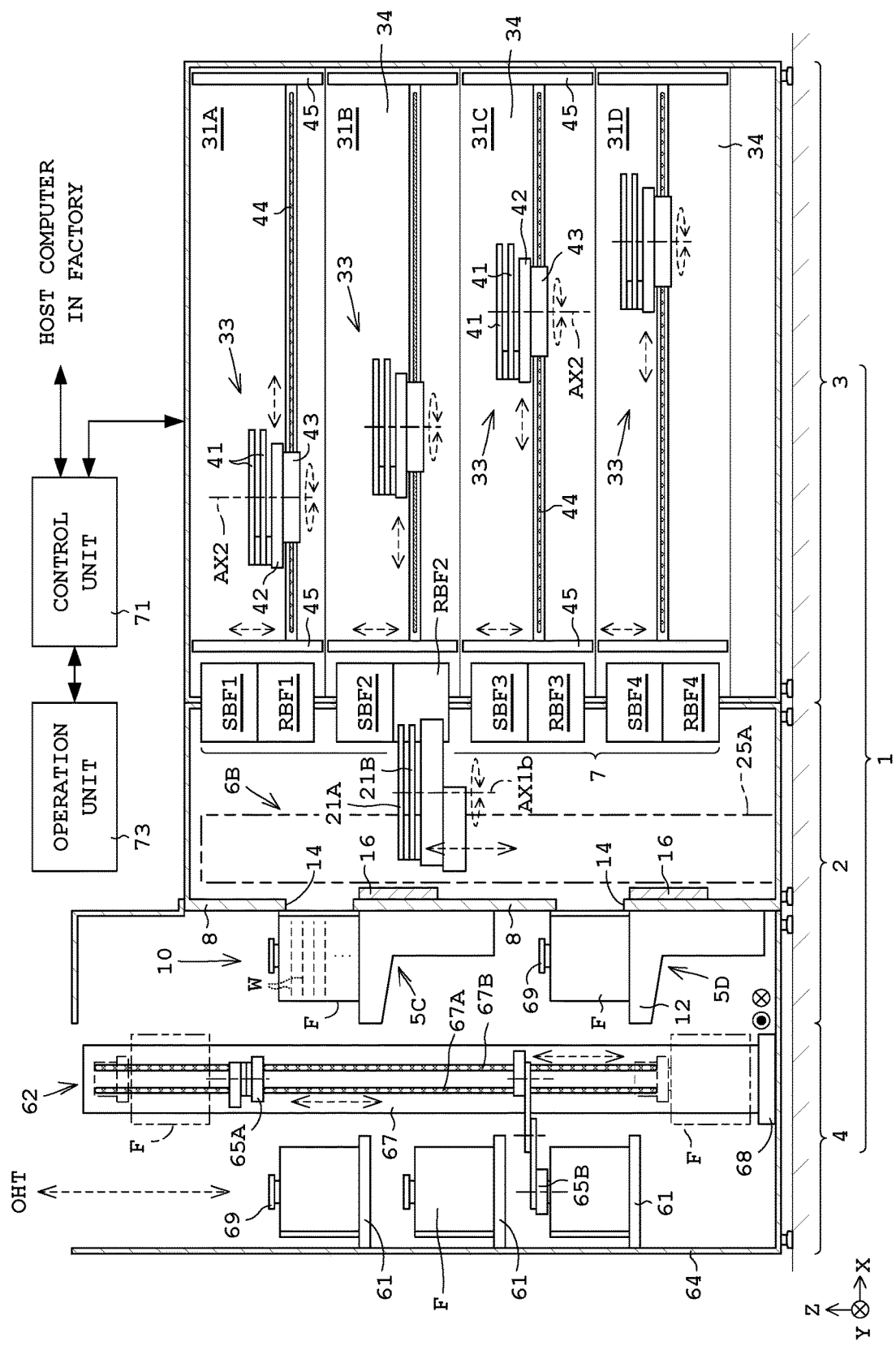
FIG. 1 is a longitudinal cross-sectional view of a substrate treating apparatus according to an embodiment.
Figure 2:
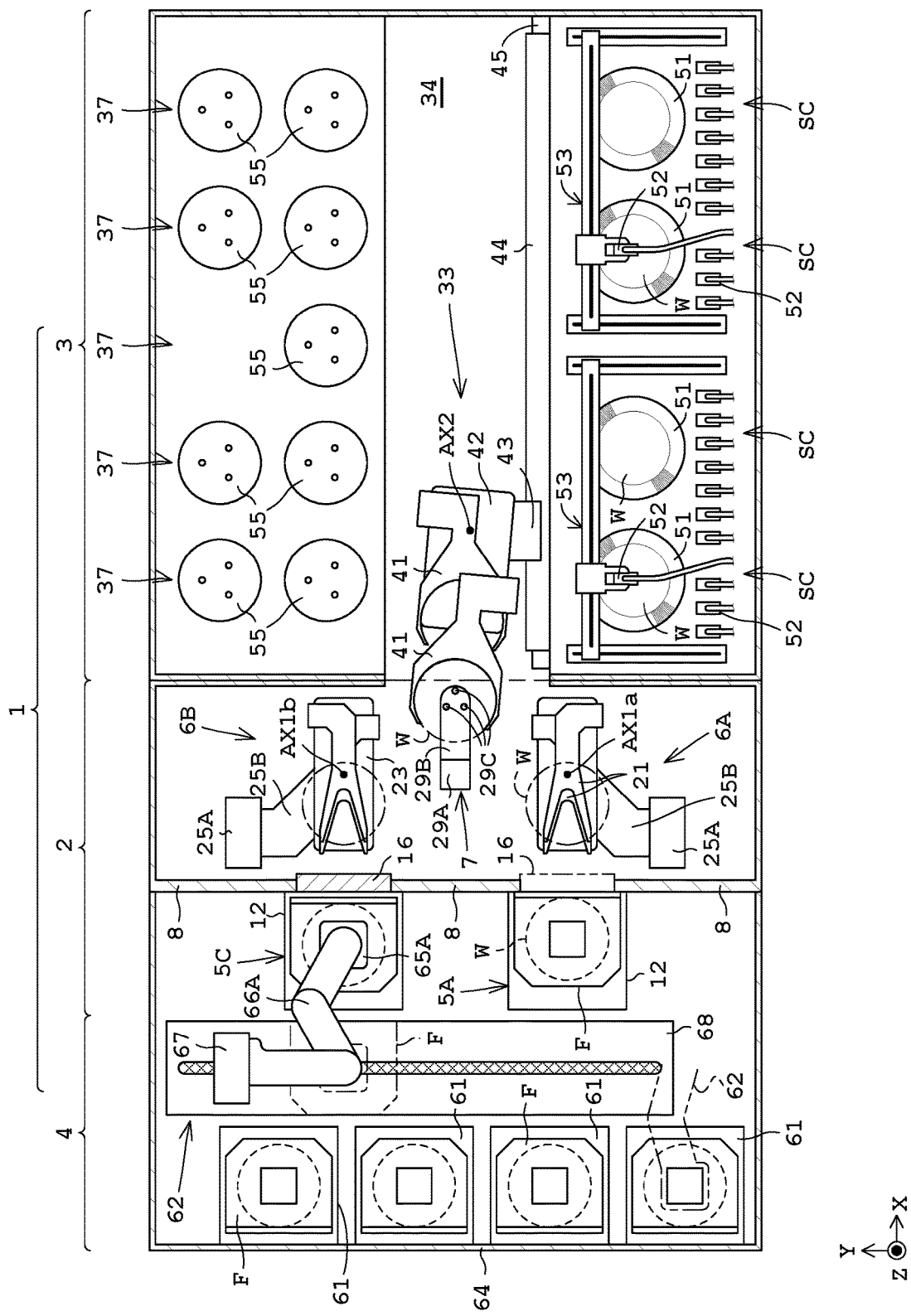
FIG. 2 is a transverse cross-sectional view of the substrate treating apparatus according to the embodiment.
Figure 3A:
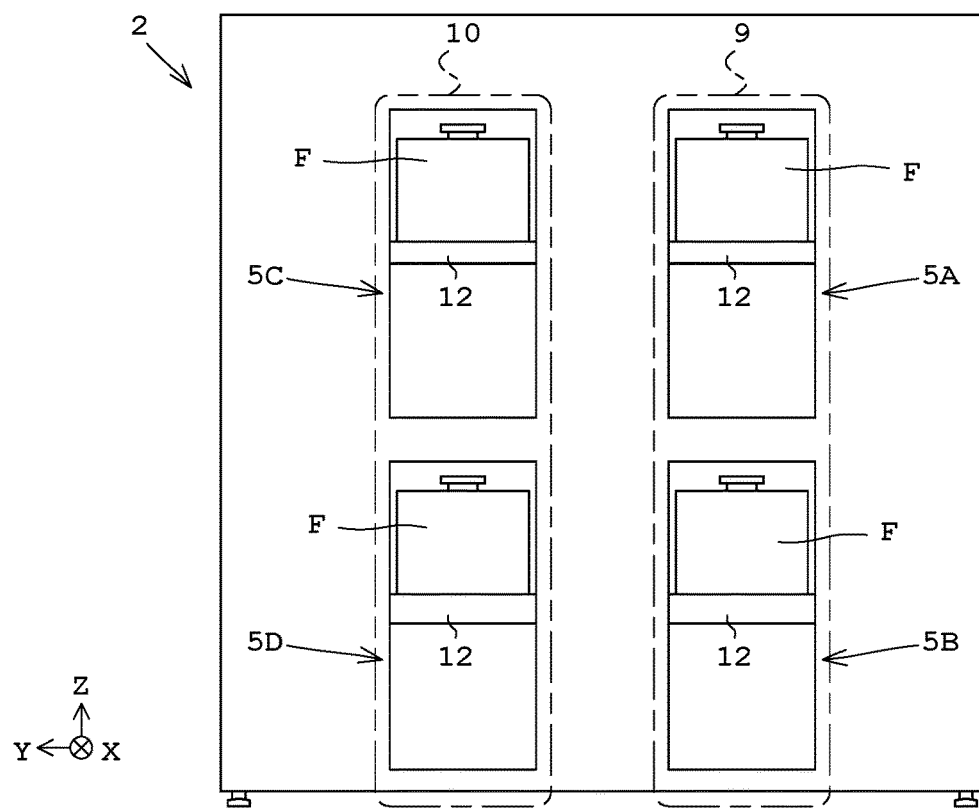
FIG. 3A is a front view illustrating four openers of an indexer block.
Figure 3B:
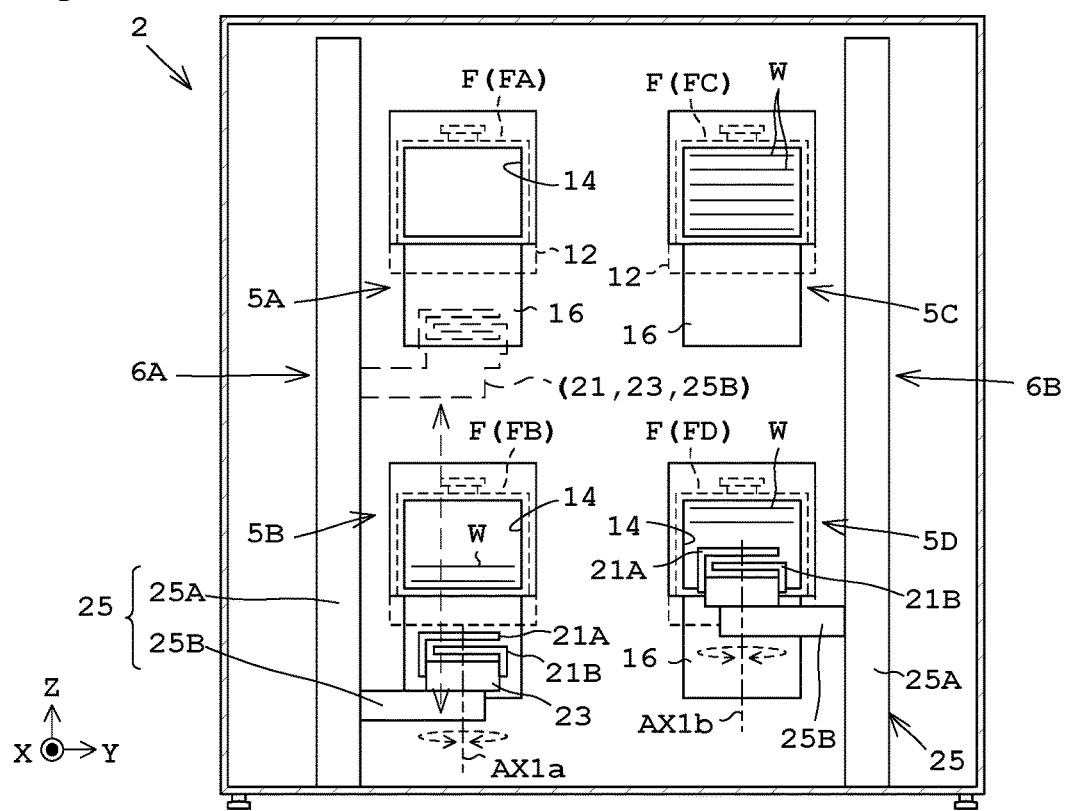
FIG. 3B is a rear view of the four openers seen from two substrate transportation mechanisms.

An embodiment of the present invention will be described hereinafter with reference to the drawings. FIG. 1 is a longitudinal cross-sectional view of a substrate treating apparatus 1 according to an embodiment. FIG. 2 is a transverse cross-sectional view of the substrate treating apparatus 1 according to the embodiment. FIG. 3A is a front view illustrating four openers 5A to 5D of an indexer block 2. FIG. 3B is a rear view of the four openers 5A to 5D seen from two substrate transportation mechanisms 6A and 6B.

Description will be made with reference to FIG. 1 or 2. The substrate treating apparatus 1 is a coating device for coating with, for example, a resist solution. The substrate treating apparatus 1 includes the indexer block 2 (hereinafter referred to as an "ID block 2" as necessary), a treating block 3, and a FOUP buffer device 4 (stocker device). The treating block 3 is coupled to a rear surface of the ID block 2. The FOUP buffer device 4 is coupled to a front surface of the ID block 2.

[ID (Indexer) Block 2]

The ID block 2 transports substrates W to a carrier. The ID block 2 includes the four openers 5A to 5D (see FIG. 3A), two substrate transportation mechanisms 6A and 6B, and a substrate buffer unit 7. The four openers 5A to 5D are provided on a wall portion 8 of the front surface of the ID block 2.

As illustrated in FIG. 3A, the four openers 5A to 5D are classified into two groups of a first opener line 9 and a second opener line 10. The first opener line 9 includes the two openers 5A and 5B disposed in the upward/downward direction. The second opener line 10 includes the two openers 5C and 5D disposed in the upward/downward direction. The second opener line 10 is disposed at a side of the first opener line 9 in the horizontal direction (Y-direction). In FIG. 3A, the first opener 5A is disposed above the second opener 5B. The third opener 5C is disposed above the fourth opener 5D.

Each of the four openers 5A to 5D corresponds to a carrier platform of the present invention. The first opener line 9 corresponds to a first carrier platform line of the present invention. The second opener line 10 corresponds to a second carrier platform line of the present invention.

A carrier is placed on each of the four openers 5A to 5D. The carrier is, for example, a FOUP F. The carrier is not limited to a FOUP F as long as the carrier has an openable lid portion. The carrier will now be described using the FOUP F as an example. The FOUP F is capable of accommodating a plurality of (e.g., 25) substrates W in a horizontal orientation. The FOUP F includes an opening through which the substrates W are inserted or taken out. The FOUP F also includes a FOUP body configured to accommodate the substrates W and a lid portion for covering the opening.

Each of the four openers 5A to 5D opens and closes the lid portion of the FOUP F placed on the opener. Each of the four openers 5A to 5D includes a mount table 12, an opening 14, a shutter 16, and a shutter driving unit (not shown). The FOUP F is placed on the mount table 12. The opening 14 is an opening for transferring the substrates W between the inside of the FOUP F and the inside of the ID block 2. The shutter 16 is used for covering the opening 14. The shutter 16 locks the lid portion at the FOUP body and cancels the locking. The shutter 16 is configured to hold the lid portion. The shutter 16 holds the lid portion by adsorbing the lid portion with a vacuum, for example. The shutter 16 is moved in the upward/downward direction and in the front-rear direction by the shutter driving unit including an electric motor.

As illustrated in FIG. 2, the first substrate transportation mechanism 6A faces the first opener line 9 (including the opener 5A). The second substrate transportation mechanism 6B faces the second opener line 10 (including the opener 5C). The first substrate transportation mechanism 6A transports substrates W between the FOUP F placed on each of the two openers 5A and 5B in the first opener line 9, and the substrate buffer unit 7. The second substrate transportation mechanism 6B transports substrates W between the FOUP F placed on each of the two openers 5C and 5D in the second opener line 10, and the substrate buffer unit 7.

Figure 4:
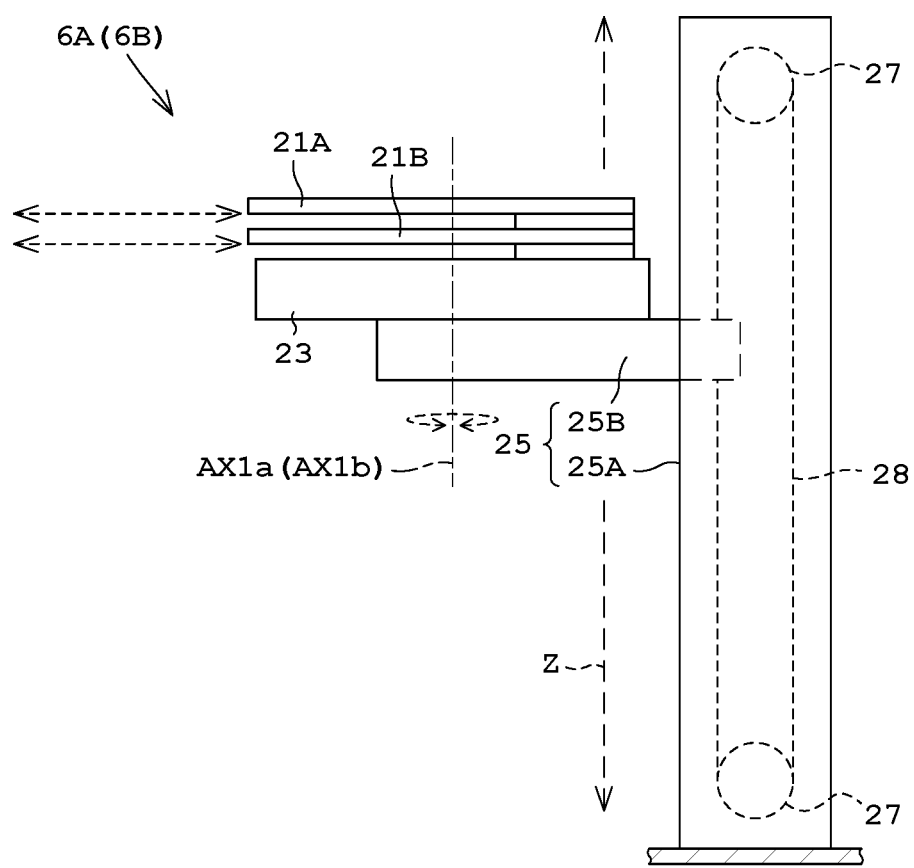
FIG. 4 illustrates a substrate transportation mechanism of the indexer block.

As illustrated in FIGS. 3B and 4, each of the two substrate transportation mechanisms 6A and 6B includes two hands 21 (21A and 21B), a forward/rearward driving unit 23, and a lifting/lowering rotation driving unit 25. Each of the two hands 21A and 21B holds a substrate W. The two hands 21A and 21B are capable of moving forward and backward individually in the horizontal direction, and one or two substrates W can be taken from the FOUP F, for example. Each of the two hands 21A and 21B has a shape whose front end is divided into two, such as a Y shape or a U shape. Each of the two substrate transportation mechanisms 6A and 6B includes the two hands 21A and 21B, but may include three or more hands.

The forward/rearward driving unit 23 movably supports the two hands 21A and 21B, and moves the two hands 21A and 21B forward and backward. To drive the first hand 21A, the forward/rearward driving unit 23 includes, for example, an electric motor, a linear screw shaft, a movable member having a hole that meshes with the screw shaft, and a guide portion that guides the movable member. The first hand 21A is supported by the movable member. Similarly, to drive the second hand 21B, the forward/rearward driving unit 23 includes, for example, an electric motor, a screw shaft, a movable member, and a guide portion.

The lifting/lowering rotation driving unit 25 lifts, lowers, and rotates the forward/rearward driving unit 23 to thereby lift, lower, and rotate the two hands 21A and 21B. The lifting/lowering rotation driving unit 25 includes a strut portion 25A and a rotation portion 25B. The strut portion 25A extends in the upward/downward direction. The strut portion 25A is fixed to the floor of the ID block 2. Accordingly, the strut portion 25A, that is, the position of the lifting/lowering rotation driving unit 25 in the horizontal direction (especially in the Y-direction), does not move and is fixed.

The rotation portion 25B is lifted and lowered along the strut portion 25A. The strut portion 25A includes, for example, an electric motor (not shown), two pulleys 27, and a belt 28. The belt 28 is wound around the two pulleys 27. The rotation portion 25B is attached to the belt 28. Rotation of the electric motor is transferred to one of the two pulleys 27 and causes the belt 28 to move. The rotation portion 25B moves together with movement of the belt 28.

The rotation portion 25B rotates the forward/rearward driving unit 23 about a vertical axis AX1$a$ or a vertical axis AX1$b$ extending along the strut portion 25A. Accordingly, orientations of the two hands 21A and 21B change. The rotation portion 25B includes, for example, an electric motor, two pulleys, and a belt.

As described above, the position of the strut portion 25A, that is, the position of the lifting/lowering rotation driving unit 25 in the horizontal direction, does not move and is fixed. Accordingly, the positions of the vertical axes AX1$a$ and AX1$b$, each of which is a rotation center of the forward/rearward driving unit 23, in the horizontal direction are also fixed. In this manner, the position of the lifting/lowering rotation driving unit 25 in the horizontal direction is fixed. Accordingly, the first substrate transportation mechanism 6A can transport substrates W between the FOUP F of each of the two openers 5A and 5B and the substrate buffer unit 7, but cannot transport substrates between the FOUP F of each of the two openers 5C and 5D and the substrate buffer unit 7. Similarly, the second substrate transportation mechanism 6B can transport substrates W between the FOUPs F of the two openers 5C and 5D and the substrate buffer unit 7, but cannot transport substrates W between the FOUPs F of the two openers 5A and 5B and the substrate buffer unit 7.

Description will now be given with reference to FIGS. 1 and 2 again. A plurality of (e.g., 32) substrates W can be placed on the substrate buffer unit 7. In the substrate buffer unit 7, each of the substrates W is supported in a horizontal orientation, and the plurality of substrates W are arranged in the upward/downward direction. As illustrated in FIG. 2, the substrate buffer unit 7 includes a strut 29A, a plurality of support plates 29B, and three support pins 29C. The strut 29A extends in the vertical direction (Z-direction). Each of the plurality of support plates 29B is supported by the strut 29A to extend in a +X-direction from the ID block 2 to the treating block 3. The three support pins 29C are individually disposed on the upper surfaces of the support plates 29B. The substrates W are supported on top of the support pins 29C. As illustrated in FIG. 2, the substrate buffer unit 7 is disposed between the ID block 2 and the treating block 3 or near a portion between the ID block 2 and the treating block 3.

[Treating Block 3]

The treating block 3 performs a coating treatment on the substrates W. As illustrated in FIG. 1, the treating block 3 includes four (a plurality of) coating-treatment layers 31A to 31D arranged in the upward/downward direction.

The substrate buffer unit 7 described above includes sending buffer units SBF1 to SBF4 and return buffer units RBF1 to RBF4. Each of the sending buffer units SBF1 to SBF4 and the return buffer units RBF1 to RBF4 includes four support plates 29B so that four substrates W can be placed on each buffer unit. For example, the sending buffer unit SBF1 and the return buffer unit RBF1 are used for the first coating-treatment layer 31A, and the sending buffer unit SBF4 and the return buffer unit RBF4 are used for the fourth coating-treatment layer 31D. Each of the two substrate transportation mechanisms 6A and 6B can transport the substrates W to all the sending buffer units SBF1 to SBF4 and the return buffer units RBF1 to RBF4.

As illustrated in FIGS. 1 and 2, each of the four coating-treatment layers 31A to 31D includes a third substrate transportation mechanism 33, a transportation space 34, a coating-treatment unit SC, and a heat-treatment unit 37. Each of the four coating-treatment layers 31A to 31D corresponds to a treatment layer of the present invention. The coating-treatment unit SC corresponds to a liquid treatment unit of the present invention.

The third substrate transportation mechanism 33 is configured to transport the substrates W in each of the four coating-treatment layers 31A to 31D. The third substrate transportation mechanism 33 includes two hands 41, a forward/rearward driving unit 42, a rotation driving unit 43, a first movement mechanism 44, and a second movement mechanism 45.

Each of the two hands 41 has a shape whose front end is divided into two, such as a Y shape or a U shape. Each of the two hands 41 holds the substrate W. The forward/rearward driving unit 42 moves the two hands 41 forward and backward individually. The rotation driving unit 43 causes the forward/rearward driving unit 42 to rotate about the vertical axis AX2. Accordingly, the orientation of each of the two hands 41 can be changed. The first movement mechanism 44 moves the rotation driving unit 43 in the rightward/leftward direction (X-direction) in FIG. 1. Accordingly, the forward/rearward driving unit 42 can be moved in the X-direction. The second movement mechanism 45 moves the first movement mechanism 44 in the upward/downward direction (Z-direction). Accordingly, the forward/rearward driving unit 42 can be moved in the Z-direction.

Each of the forward/rearward driving unit 42, the rotation driving unit 43, the first movement mechanism 44, and the second movement mechanism 45 includes an electric motor.

As illustrated in FIG. 2, the third substrate transportation mechanism 33 is disposed in the transportation space 34. The transportation space 34 is configured to extend in the horizontal direction (X-direction) linearly. As illustrated in FIG. 2, the transportation space 34 is a rectangular space when seen from above the substrate treating apparatus 1. The coating-treatment unit SC and the heat-treatment unit 37 sandwich the transportation space 34.

The coating-treatment unit SC is disposed along the transportation space 34, and is horizontal with respect to the transportation space 34.

Figure 5:
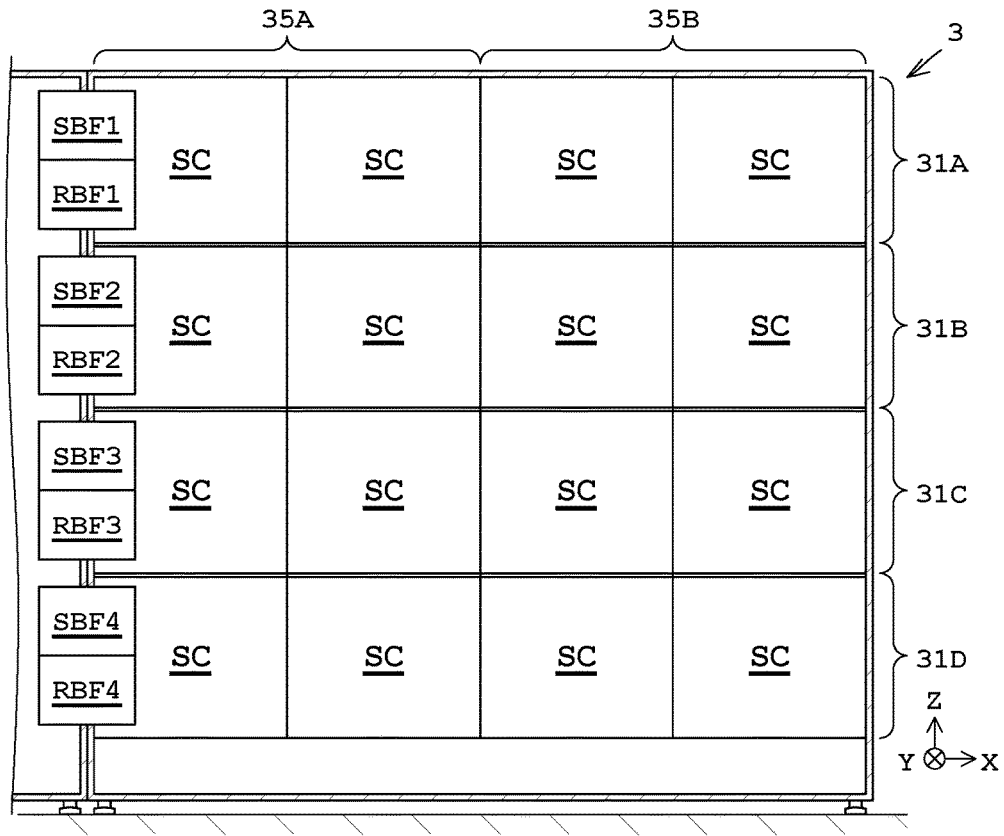
FIG. 5 is a right side view of a treating block illustrating arrangement of coating-treatment units.

The coating-treatment unit SC forms a coating by supplying a coating solution onto the substrates W. FIG. 5 is a right side view of the treating block 3 illustrating arrangement of the coating-treatment units SC. Each of the four coating-treatment layers 31A to 31D includes four coating-treatment units SC. In each of the coating-treatment layers 31A to 31D, the coating-treatment units SC are arranged such that the coating-treatment units SC are not overlaid on one another in, for example, two levels but are arranged in a single level. In the four coating-treatment layers 31A to 31D, liquid treatment units are not overlaid on one another in a plurality of levels but are arranged in a single level so that the height of each of the coating-treatment layers 31A to 31D is reduced and, accordingly, the height of the treating block 3 can be reduced.

In each of the coating-treatment layers 31A to 31D, the coating-treatment units SC are arranged in four lines in the horizontal direction and a single level in the upward/downward direction, that is, the coating-treatment units SC are arranged in 4 lines×1 level. The substrates W are treated in parallel in the four coating-treatment layers 31A to 31D. Thus, it is possible to increase throughput of the substrate treatment by increasing the number of parallel treatments while reducing the height of the treating block 3.

In FIG. 5, for example, the four coating-treatment units SC arranged in the horizontal direction are constituted by units denoted by 35A and units denoted by 35B. The two left coating-treatment units SC denoted by 35A are units for forming anti-reflection films on substrates W (hereinafter referred to as "BARC units" as appropriate). The two right coating-treatment units SC denoted by 35B are units for forming resist films on substrates W (hereinafter referred to as "RESIST units" as appropriate).

As illustrated in FIG. 2, each of the coating-treatment units SC includes a holding rotation portion 51, a plurality of nozzles 52, and a nozzle moving mechanism 53. The holding rotation portion 51 holds substrates W by, for example, vacuum adsorption and rotates the substrates W held by the holding rotation portion 51 about the vertical axis (Z-direction). The plurality of nozzles 52 are configured to supply a coating solution (e.g., a solution for forming an anti-reflection film or a photoresist solution) to the substrates W. The nozzle moving mechanism 53 grasps one of the plurality of nozzles 52, and moves the nozzle 52 held by the nozzle moving mechanism 53 in the upward/downward direction (Z-direction) and the horizontal direction (XY-directions) between a standby position of each nozzle 52 and a supply position above the center of the substrates W.

Figure 6:
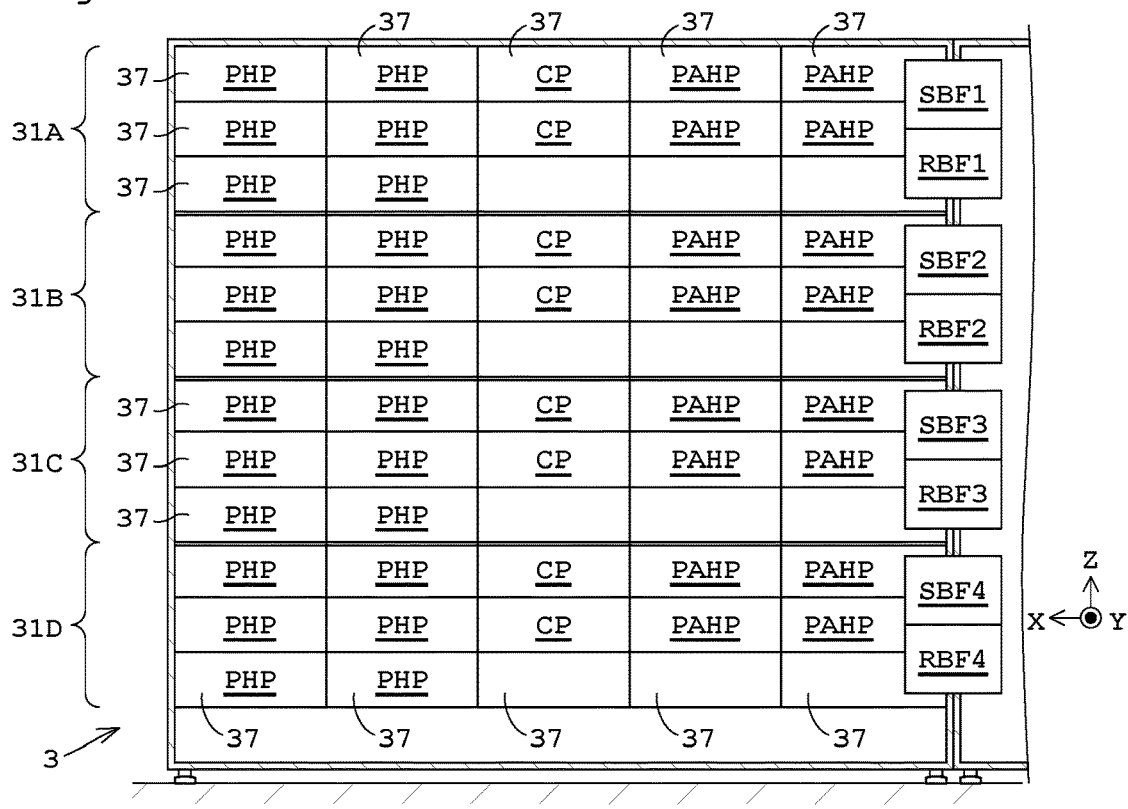
FIG. 6 is a left side view of the treating block illustrating arrangement of heat-treatment units.

The heat-treatment unit 37 is disposed along the transportation space 34, and is horizontal with respect to the transportation space 34. The heat-treatment unit 37 includes a plate 55 for performing a heat treatment on substrates W. FIG. 6 is a left side view of the treating block 3 illustrating arrangement of the heat-treatment units 37. Each of the four coating-treatment layers 31A to 31D includes four adhesion enhancing treatment units PAHP, two cooling units CP, and six heating/cooling units PHP. That is, each of the layers 31A to 31D includes 12 heat-treatment units 37.

The adhesion enhancing treatment units PAHP are configured to apply an adhesion enhancing agent such as hexamethyldisilazane (HMDS) to substrates W and heats the resulting substrates W to thereby enhance adhesion between the substrates W and the anti-reflection films. The adhesion enhancing treatment units PAHP also have the function of cooling the substrates W after heating. The cooling units CP cool the substrates W. The heating/cooling units PHP sequentially perform heating and cooling in this order. As illustrated in FIG. 6, the heat-treatment units 37 are arranged in five lines in the horizontal direction and three levels in the upward/downward direction, that is, the heat-treatment units 37 are arranged in 5 lines×3 levels, in each of the layers 31A to 31D.

An operation of the treating block 3 will now be described using the coating-treatment layer 31A as an example. As illustrated in FIGS. 1 and 2, the third substrate transportation mechanism 33 of the coating-treatment layer 31A receives a substrate W from the sending buffer unit SBF1 using the two hands 41. The third substrate transportation mechanism 33 transports the received substrate W to the adhesion enhancing treatment units PAHP, the cooling units CP, and the BARC units (SC) illustrated in FIGS. 5 and 6 in this order. Thereafter, the third substrate transportation mechanism 33 transports the substrate W on which an anti-reflection film is formed by the BARC unit, to the heating/cooling units PHP, the cooling units CP, the RESIST units (SC), and the heating/cooling units PHP in this order, by using the two hands 41. The third substrate transportation mechanism 33 transports the substrate W treated by these units, to the return buffer unit RBF1 by using the two hands 41.

The third substrate transportation mechanism 33 moves the forward/rearward driving unit 42 to a position near a target unit (e.g., the cooling unit CP) to/from which the substrate W is sent or received. Subsequently, the forward/rearward driving unit 42 moves the first hands 41 holding no substrates W forward and backward, and receives the substrate W placed on the target unit. Then, the forward/rearward driving unit 42 moves the second hands 41 holding the substrates W forward and backward, and sends (places) the substrate W to the target unit.

[FOUP Buffer Device 4]

As illustrated in FIGS. 1 and 2, the FOUP buffer device 4 includes a plurality of (e.g., 12) shelves 61 and a FOUP transportation mechanism 62 for transporting FOUPs F.

The plurality of shelves 61 face the two opener lines 9 and 10 (e.g., two openers 5C and 5D illustrated in FIG. 1). The FOUP transportation mechanism 62 is disposed between the two opener lines 9 and 10 and the plurality of shelves 61. The FOUP transportation mechanism 62 is disposed at the side opposite to the two substrate transportation mechanisms 6A and 6B with the two opener lines 9 and 10 sandwiched between the FOUP transportation mechanism 62 and the two substrate transportation mechanisms 6A and 6B.

Figure 7A:
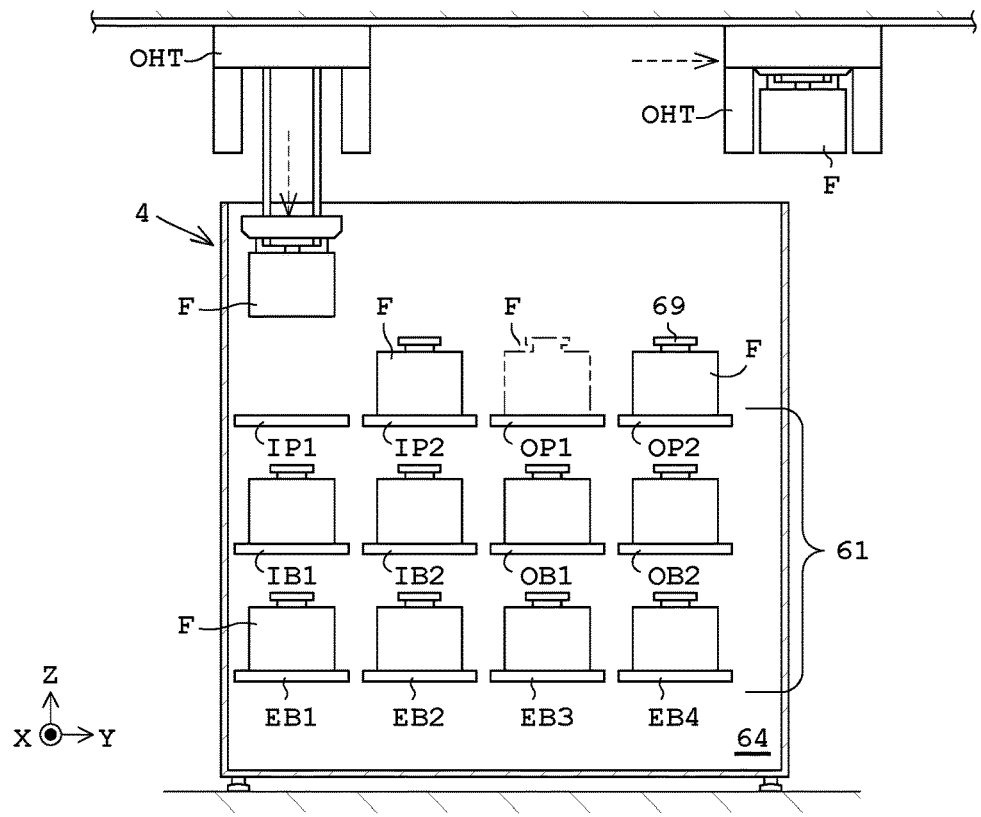
FIG. 7A illustrates shelves of a FOUP buffer device seen from a FOUP transportation mechanism.
Figure 7B:
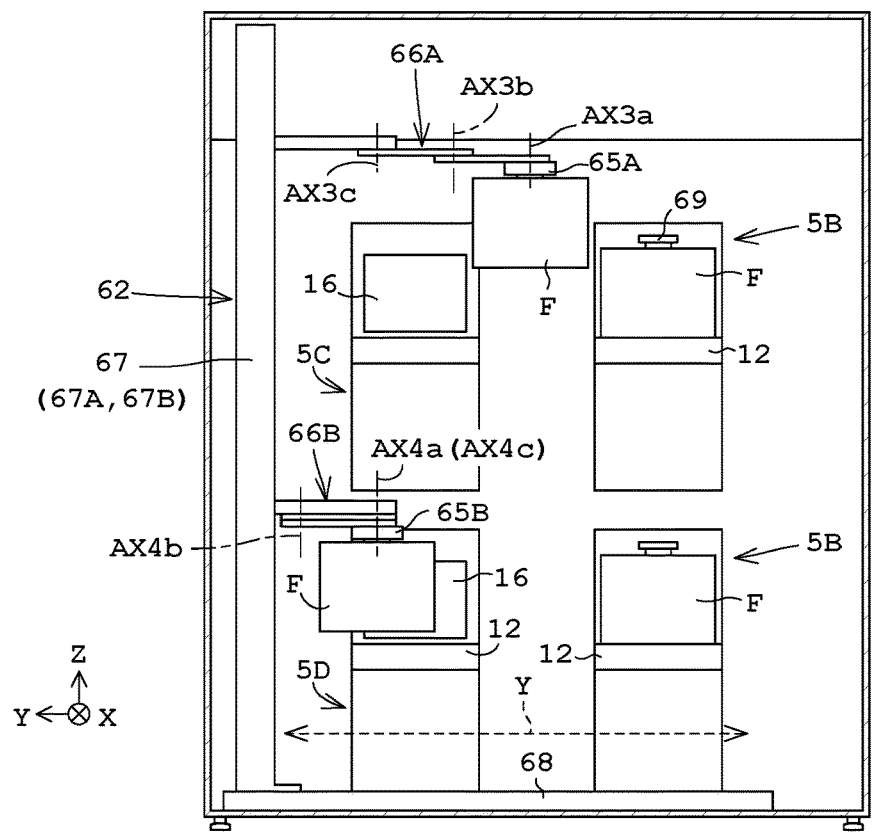
FIG. 7B is a front view illustrating four openers and the FOUP transportation mechanism.

FIG. 7A is a view illustrating the shelves 61 of the FOUP buffer device 4 seen from the FOUP transportation mechanism 62. FIG. 7B is a front view illustrating the four openers 5A to 5D and the FOUP transportation mechanism 62 seen from the shelves 61.

The shelves 61 are configured such that FOUPs F are placed on the shelves 61. The shelves 61 are disposed on a wall portion 64 at the left side (front side) of FOUP buffer device 4 illustrated in FIG. 1. As illustrated in FIG. 7A, the shelves 61 include, for example, two input ports IP1 and IP2 (also referred to as input load ports), two output ports OP1 and OP2 (also referred to as output load ports), two untreated substrate FOUP shelves IB1 and IB2, two treated substrate FOUP shelves OB1 and OB2, four empty FOUP shelves EB1 to EB4. The number and functions of the shelves 61 are set as necessary.

The two input ports IP1 and IP2 are used for receiving FOUPs F from an external transportation mechanism OHT (overhead hoist transport) that transports FOUPs F in a factory. The two output ports OP1 and OP2 are used for sending FOUPs F accommodating treated substrates W to the external transportation mechanism OHT. The two input ports IP1 and IP2 and the two output ports OP1 and OP2 are disposed at the highest level of the shelves 61. To send and receive FOUPs F to/from the external transportation mechanism OHT, a ceiling portion of the FOUP buffer device 4 is open.

In a case where the two openers 5A and 5B are used for taking (sending) substrates W, for example, the two untreated substrate FOUP shelves IB1 and IB2 are used for accommodating FOUPs F that cannot be transported to the two openers 5A and 5B. In a case where the two openers 5C and 5D are used for accommodating (returning) substrates W, for example, the treated substrate FOUP shelves OB1 and OB2 are used for accommodating FOUPs F that cannot be transported from the two openers 5C and 5D to the output ports OP1 and OP2. The four empty FOUP shelves EB1 to EB4 are used for holding empty FOUPs F from which the substrates W have been taken.

As illustrated in FIG. 7B, the FOUP transportation mechanism 62 includes two grippers 65A and 65B, two articulated arms 66A and 66B, an elevation driving unit 67, and horizontal driving unit 68. Each of the two grippers 65A and 65B is configured to grasp a FOUP F. Specifically, each of the two grippers 65A and 65B is configured to grasp a projection 69 provided on top of the FOUP F. The first gripper 65A is attached to a first end portion of the first articulated arm 66A to be rotatable about the vertical axis AX3a. The second gripper 65B is attached to a first end portion of the second articulated arm 66B to be rotatable about the vertical axis AX4a.

Each of the two articulated arms 66A and 66B is of a scalar type, for example. The first articulated arm 66A moves the gripper 65A to a given position in the horizontal direction by rotation of support members coupled to portions around the two vertical axes AX3b and AX3c. The first articulated arm 66A also rotates the first gripper 65A about the vertical axis AX3a to adjust the orientation of the FOUP F. Similarly, the second articulated arm 66B moves the gripper 65B to a given position in the horizontal direction by rotation of support members coupled to portions around two vertical axes AX4b and AX4c. The second articulated arm 66B adjusts the orientation of the FOUP F by rotation of the second gripper 65B about the vertical axis AX4a. Each of the two articulated arms 66A and 66B is attached to the elevation driving unit 67.

As illustrated in FIG. 1, the elevation driving unit 67 includes two driving units 67A and 67B. The first driving unit 67A lifts and lowers the first articulated arm 66A in the upward/downward direction, and the second driving unit 67B lifts and lowers the second articulated arm 66B in the upward/downward direction. That is, the two grippers 65A and 65B are lifted and lowered independently of each other. The two driving units 67A and 67B are arranged in the horizontal direction (e.g., the X-direction).

The first gripper 65A and the first articulated arm 66A are located above the second gripper 65B and the second articulated arm 66B. That is, to prevent collision, the first gripper 65A and the first articulated arm 66A are configured not to move to be below the second gripper 65B and the second articulated arm 66B. In this regard, the elevation driving unit 67 may be configured to move the gripper 65A such that the gripper 65A is located above or below the gripper 65B.

The horizontal driving unit 68 moves the elevation driving unit 67 in the horizontal direction (Y-direction). Accordingly, the two grippers 65A and 65B can approach a FOUP F to which the two articulated arms 66A and 66B cannot reach in a movable range in the horizontal direction. In FIG. 7B, each of the two grippers 65A and 65B can transport FOUPs F to the shelves 61 and all the four openers 5A to 5D.

Each of the two grippers 65A and 65B, the two articulated arms 66A and 66B, the elevation driving unit 67 (two driving units 67A and 67B), and the horizontal driving unit 68 includes an electric motor. Each of the two driving units 67A and 67B may include two pulleys and a belt, for example. The grippers and the articulated arms, for example, may be provided in one pair or three or more pairs, as necessary.

As illustrated in FIG. 1, the substrate treating apparatus 1 includes one or more control units 71 and an operation unit 73. Each of the control units 71 includes, for example, a central processing unit (CPU). The control units 71 control components of the substrate treating apparatus 1. The operation unit 73 includes a display section (e.g., liquid crystal monitor), a memory section, and an input section. The memory section includes, for example, at least one of a read-only memory (ROM), random-access memory (RAM), and a hard disk. The input section includes at least one of a keyboard, a mouse, a touch panel, and various buttons. The memory section stores conditions for substrate treatments and operation programs necessary for controlling the substrate treating apparatus 1.

<Operation of Substrate Treating Apparatus 1>

An operation of the substrate treating apparatus 1 will now be described. First, operations of the two substrate transportation mechanisms 6A and 6B of the substrate treating apparatus 1 will be described.

In FIG. 2, the FOUP transportation mechanism 62 transports a FOUP F to the opener 5A. The shutter 16 of the opener 5A unlocks the lid of the FOUP F placed on the mount table 12 of the opener 5A and holds the lid. Thereafter, the shutter 16 slides downward while uncovering the lid from the FOUP F to thereby allow the opening 14 (see FIG. 3B) to open. Operations of the two openers 5A and 5B (see FIG. 3B) and the first substrate transportation mechanism 6A are previously set for taking (sending) substrates W as normal operations. Thus, the first substrate transportation mechanism 6A starts taking the substrates W from the FOUP F placed on the opener 5A, for example. The substrates W taken from the FOUP F are transported to the substrate buffer unit 7.

[Taking Operation of Substrate W by First Substrate Transportation Mechanism 6A]

Figure 8A:
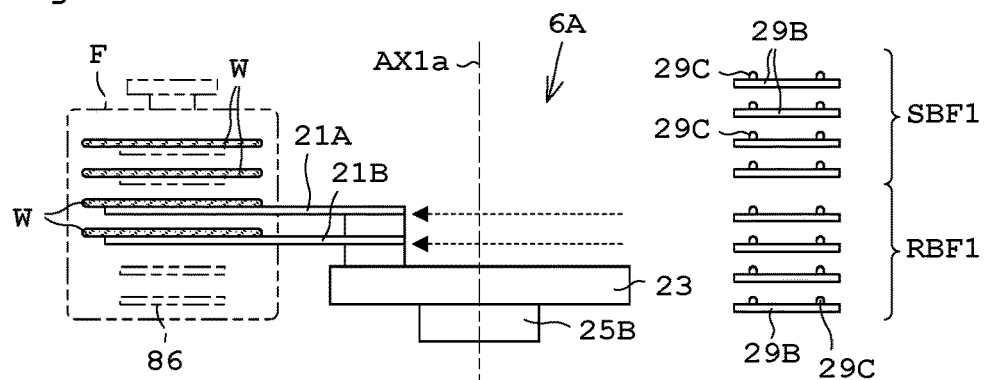
FIGS. 8A to 8D are illustrations for describing an operation of transporting substrates from a FOUP to a buffer unit by a first substrate transportation mechanism.

In FIG. 8A, the forward/rearward driving unit 23 of the first substrate transportation mechanism 6A moves the two hands 21 (21A and 21B) forward to thereby cause the two hands 21 to enter a FOUP F. After the entering, the lifting/lowering rotation driving unit 25 (see FIG. 4) slightly lifts the two hands 21. Accordingly, two substrates W are picked up and held by the two hands 21. After picking up the two substrates W, the forward/rearward driving unit 23 moves the two hands 21 backward while holding the two substrates W.

After the two substrates W have been taken from the FOUP F, these two substrates W are transported to the sending buffer unit SBF1 of the substrate buffer unit 7. A specific operation will be sequentially described. The lifting/lowering rotation driving unit 25 lifts and lowers (lifts in FIG. 8B) the two hands 21 and the forward/rearward driving unit 23 along the vertical axis AX1a, and rotates the two hands 21 and the forward/rearward driving unit 23 about the vertical axis AX1a. Accordingly, the two hands 21 are moved to predetermined heights of the sending buffer unit SBF1 where two substrates W to be held are placed, and at the same time, the two hands 21 are turned to face the sending buffer unit SBF1.

Figure 8B:
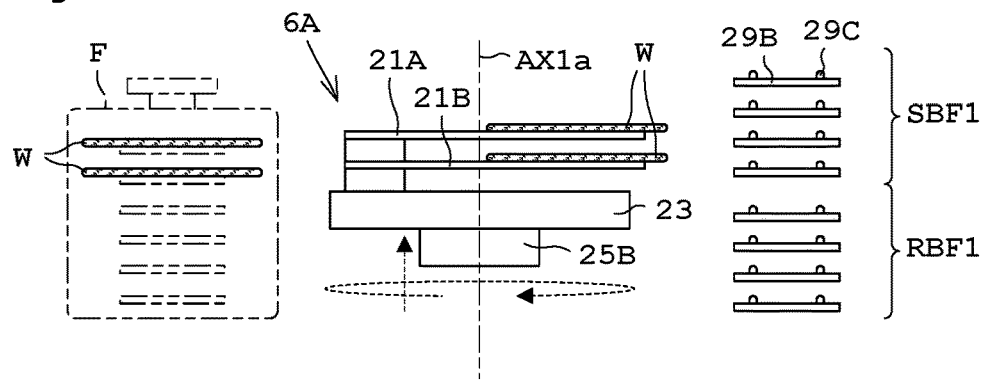
Figure 8C:
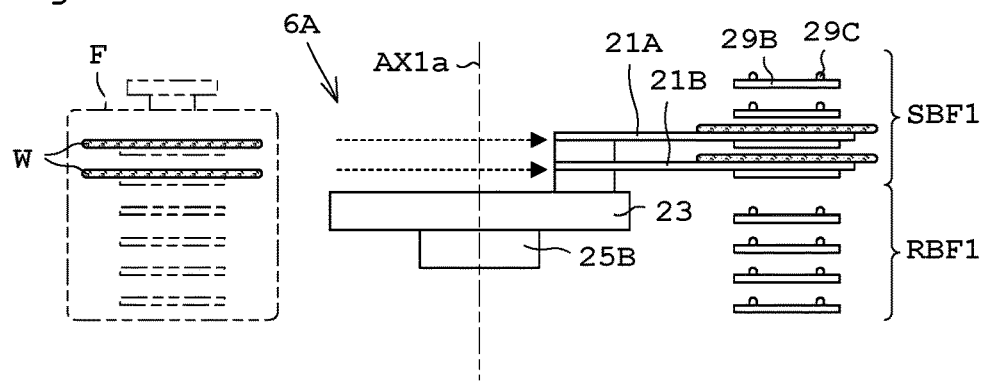

In FIG. 8C, the forward/rearward driving unit 23 moves the two hands 21 holding the two substrates W forward to thereby cause the two hands 21 to enter a region of the sending buffer unit SBF1. After the entering, the lifting/lowering rotation driving unit 25 slightly lowers the two hands 21. Accordingly, the two hands 21 place the two substrates W on the support pins 29C. After the two substrates W have been placed, the forward/rearward driving unit 23 moves the two hands 21 holding no substrates W backward.

After the two substrates W have been transported to the sending buffer unit SBF1, one or two substrates W are taken out again from the FOUP F. Specifically, in FIG. 8D, the lifting/lowering rotation driving unit 25 lifts and lowers (lowers in FIG. 8D) the two hands 21 and the forward/rearward driving unit 23 along the vertical axis AX1a, and rotates the two hands 21 and the forward/rearward driving unit 23 about the vertical axis AX1a. Accordingly, while the two hands 21 are moved to a position facing one or two substrates W to be taken next, the two hands 21 are oriented to face the one or two substrates W. Thereafter, the one or two substrates W are taken from the FOUP F.

Operations shown in FIGS. 8A to 8D are repeated until all the substrates W are taken from the FOUP F. In these operations, the four coating-treatment layers 31A to 31D of the treating block 3 illustrated in FIG. 1 are subjected to parallel treatment. Accordingly, in a case where two substrates W taken from the FOUP F are transported to the sending buffer unit SBF1, two substrates W that are taken next are transported to the sending buffer unit SBF2. Then, two substrates W that are taken next are transported to the sending buffer unit SBF3. Thereafter, two substrates W that are taken next are transported to the sending buffer unit SBF4. Subsequently, two substrates W that are taken next are transported to the sending buffer unit SBF1 again.

As described above, substrates W are uniformly distributed to the "sending buffer unit SBF1," the "sending buffer unit SBF2," the "sending buffer unit SBF3," and the "sending buffer unit SBF4" in this order. As illustrated in FIGS. 8A to 8C, the first substrate transportation mechanism 6A sequentially takes substrates W from a bottom level 86 of the FOUP F, and sequentially places the substrates W in the ascending order from the support plate 29B of the sending buffer unit SBF1.

Figure 8D:
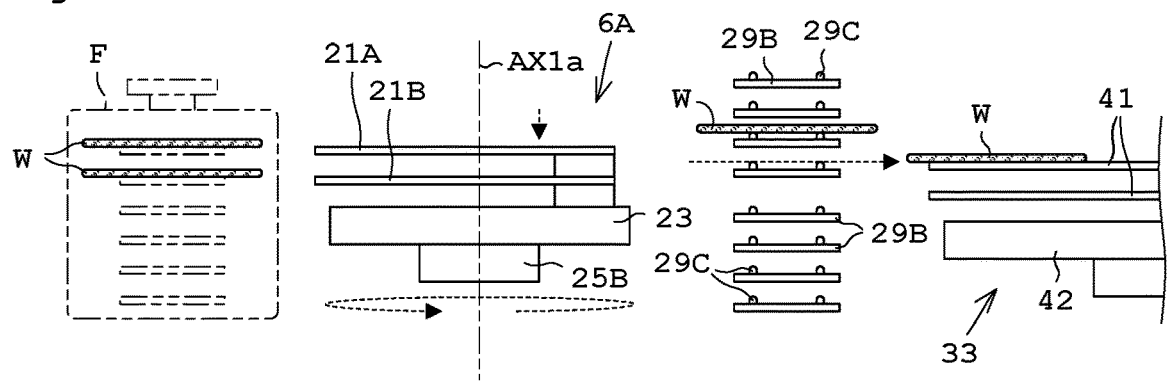

In FIG. 8D, the third substrate transportation mechanism 33 of the first coating-treatment layer 31A has received one substrate W placed on the support plates 29B of the sending buffer unit SBF1. The received substrate W is subjected to a predetermined treatment in the first coating-treatment layer 31A.

[Storage (Return) Operation of Substrate W by Second Substrate Transportation Mechanism 6B]

Figure 9A:
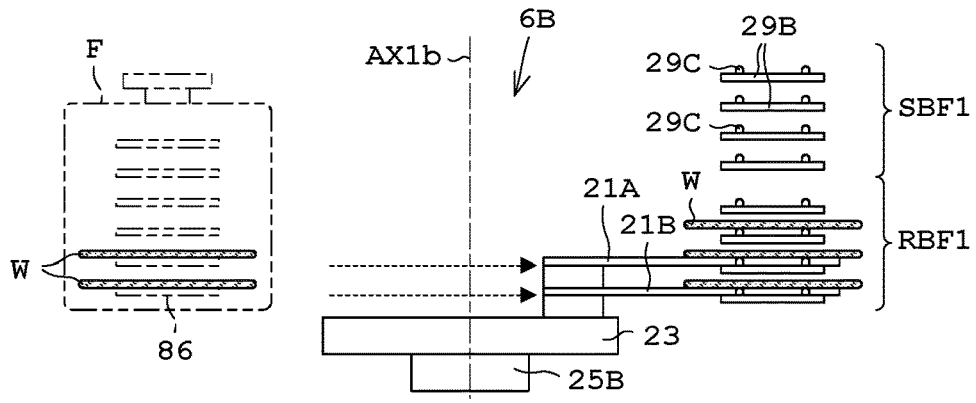
FIGS. 9A to 9D are illustrations for describing an operation of transporting substrates from a return buffer unit to a FOUP by a second substrate transportation mechanism.

In FIG. 9A, three substrates W are placed on the support plates 29B at the first to third levels from the bottom of the return buffer unit RBF1. The three substrates W are substrates W transported by the third substrate transportation mechanism 33 and subjected to the predetermined treatment in the first coating-treatment layer 31A. The forward/rearward driving unit 23 of the second substrate transportation mechanism 6B moves the two hands 21 forward to thereby cause the two hands 21 to enter a region of the return buffer unit RBF1. After the entering, two substrates W are picked up and held by the two hands 21. After picking up the two substrates W, the forward/rearward driving unit 23 moves the two hands 21 backward while holding the two substrates W.

After the two substrates W have been received from the return buffer unit RBF1, the received two substrates W are accommodated in the FOUP F placed on the opener 5C, for example. A specific operation will be described in order. The lifting/lowering rotation driving unit 25 lifts and lowers (lifts in FIG. 9B) the two hands 21 and the forward/rearward driving unit 23 along the vertical axis AX1b, and rotates the two hands 21 and the forward/rearward driving unit 23 about the vertical axis AX1b. Accordingly, while the two hands 21 are moved to a position facing accommodating spaces at the third and fourth levels from the bottom of the FOUP F to which the substrates W are transported, the two hands 21 are oriented toward the accommodating spaces.

Figure 9B:
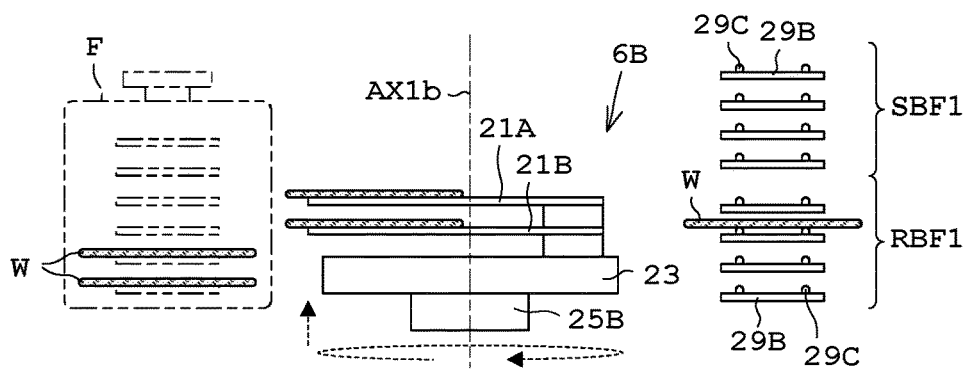
Figure 9C:
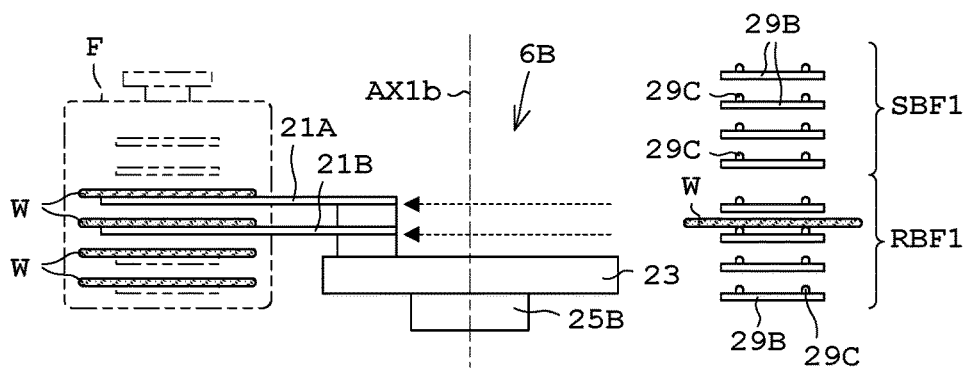

In FIG. 9C, the forward/rearward driving unit 23 moves the two hands 21 holding the two substrates W forward to thereby cause the two hands 21 to enter the FOUP F. After the entering, the two hands 21 places the two substrates W on the third and fourth levels from the bottom in the FOUP F. After the two substrates W have been placed, the forward/rearward driving unit 23 moves the two hands 21 holding no substrates W backward.

After the treated two substrates W have been accommodated in the FOUP F, one or two substrates W are received again from a return buffer unit except for the return buffer unit RBF1, such as the return buffer unit RBF2. That is, while the two hands 21 are moved to a position facing one or two substrates W to be taken next, the two hands 21 are oriented to face the one or two substrates W. Thereafter, the one or two substrates W are received.

Operations as illustrated in FIGS. 9A to 9D are repeated so that substrates W are accommodated in the FOUP F. At this time, parallel treatment is performed in the four coating-treatment layers 31A to 31D of the treating block 3 illustrated in FIG. 1. Thus, after two substrates W have been transported from the return buffer unit RBF1 to the FOUP F, two substrates W are transported from the return buffer unit RBF2 to the FOUP F. Thereafter, two substrates W are transported from the return buffer unit RBF3 to the FOUP F. Subsequently, two substrates W are transported from the return buffer unit RBF4 to the FOUP F. Then, two substrates W are transported from the return buffer unit RBF1 to the FOUP F again.

In the manner described above, substrates W are uniformly returned to the FOUP F in the order of the "return buffer unit RBF1," the "return buffer unit RBF2," the "return buffer unit RBF3," and the "return buffer unit RBF4". As illustrated in FIGS. 9A to 9C, the second substrate transportation mechanism 6B sequentially receives substrates W in the ascending order from the return buffer unit SFB1, and sequentially accommodates the substrates W from the bottom level 86 of the FOUP F.

Once all the substrates W are accommodated in the FOUP F, the shutter 16 of the opener 5C closes the opening 14 while attaching the lid to the FOUP body. Thereafter, the shutter 16 of the opener 5C locks the lid of the FOUP F placed on the mount table 12 of the opener 5C to release holding of the lid. Subsequently, the FOUP transportation mechanism 62 transports the FOUP F from the opener 5C. The phrase "all the substrates W are accommodated in the FOUP F" refers to a state where 24 substrates W are accommodated in a case where 24 substrates W are accommodated in the FOUP F.

Figure 9D:
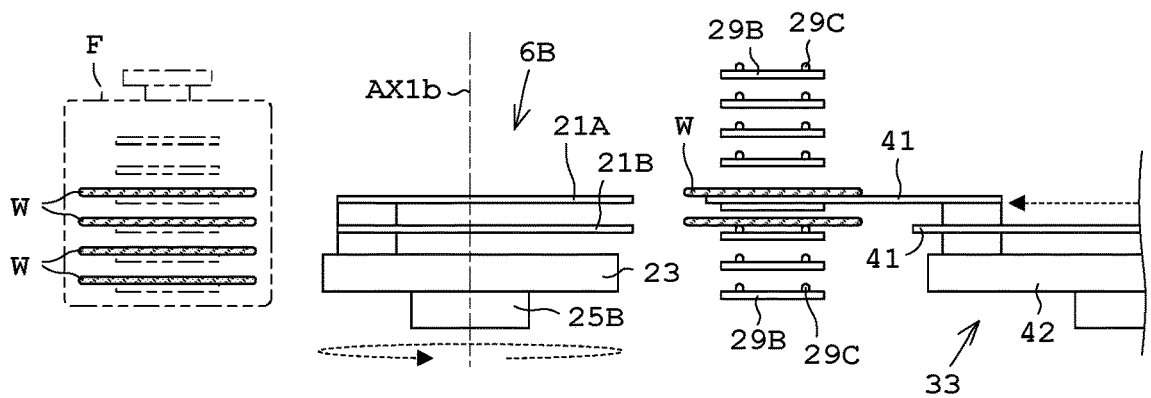

In FIG. 9D, the third substrate transportation mechanism 33 of the first coating-treatment layer 31A places one treated substrate W on the support plate 29B of the return buffer unit RBF1.

[Substrate Transportation on Two Openers 5A and 5B]

Next, an operation of the first substrate transportation mechanism 6A on two FOUPs FA and FB placed on the two openers 5A and 5B will be described.

The two openers 5A and 5B and the first substrate transportation mechanism 6A are previously configured to perform an operation of taking (sending) substrates W from a FOUP F, as a normal operation. Description will be given with reference to FIG. 3B. The first substrate transportation mechanism 6A takes a substrate W from a FOUP FA placed on the opener 5A. The substrate W taken from the FOUP FA is transported to the substrate buffer unit 7. Then, the first substrate transportation mechanism 6A takes all the substrates W from the FOUP FA. Here, supposing no opener 5B illustrated in FIG. 3B are provided. In this case, the first substrate transportation mechanism 6A is in a standby state until the FOUP FA of the opener 5A that has become empty is replaced by another FOUP F by the FOUP transportation mechanism 62. Thus, substrates W cannot be supplied to the treating block 3 anymore.

The FOUP buffer device 4, however, includes the opener 5B in addition to the opener 5A. Thus, after having taken all the substrates W from the FOUP FA of the opener 5A, the first substrate transportation mechanism 6A can start taking substrates W from a FOUP FB of the opener 5B. Accordingly, standby time of the first substrate transportation mechanism 6A can be reduced. In addition, the two openers 5A and 5B are disposed in the upward/downward direction along the lifting and lowering paths of the two hands 21 and the forward/rearward driving unit 23 of the first substrate transportation mechanism 6A. Thus, the two hands 21 and the forward/rearward driving unit 23, for example, do not need to be moved in the Y-direction, and thus, it is possible to move the two hands 21 of the first substrate transportation mechanism 6A while preventing a reduction of efficiency in transporting substrates W.

After having taken all the substrates W from the FOUP FB of the opener 5B, the first substrate transportation mechanism 6A starts taking substrates W from a third FOUP F placed on the opener 5A, instead of the FOUP FA. That is, the first substrate transportation mechanism 6A is configured to alternately take substrates W from the FOUP F placed on the opener 5A and the FOUP F placed on the opener 5B in units of FOUPs.

[Substrate Transportation on Two Openers 5C and 5D]

Next, an operation of the second substrate transportation mechanism 6B on two FOUPs FC and FD placed on the two openers 5C and 5D will be described.

The two openers 5C and 5D and the second substrate transportation mechanism 6B are previously configured to perform an operation of accommodating (returning) substrates W in a FOUP F, as a normal operation. Description will be given with reference to FIG. 3B. The second substrate transportation mechanism 6B accommodates all the substrates W received from the substrate buffer unit 7 in the FOUP FC placed on the opener 5C. Here, supposing the opener 5D illustrated in FIG. 3B is not provided. In this case, the second substrate transportation mechanism 6B is in a standby state until the FOUP FC (accommodating all the treated substrates W) placed on the opener 5C is replaced by another FOUP F by the FOUP transportation mechanism 62. Accordingly, substrates W treated by the treating block 3 cannot be accommodated in the FOUP F anymore.

The FOUP buffer device 4, however, includes the opener 5D in addition to the opener 5C. Thus, after having taken all the treated substrates W in the FOUP FC of the opener 5C, the second substrate transportation mechanism 6B can start accommodating substrates W in the FOUP FD of the opener 5D. Accordingly, standby time of the second substrate transportation mechanism 6B can be reduced. In addition, the two openers 5C and 5D are disposed in the upward/downward direction along the lifting and lowering paths of the two hands 21 and the forward/rearward driving unit 23 of the second substrate transportation mechanism 6B. Thus, the two hands 21 and the forward/rearward driving unit 23, for example, do not need to be moved in the Y-direction, and thus, it is possible to move the two hands 21 of the second substrate transportation mechanism 6B while preventing a reduction of efficiency in transporting substrates W.

After all the substrates W have been accommodated in the FOUP FD of the opener 5D, the second substrate transportation mechanism 6B starts accommodating the substrates W in the third FOUP F placed on the opener 5C. That is, the second substrate transportation mechanism 6B is configured to alternately accommodate substrates W in the FOUP F placed on the opener 5C and the FOUP F placed on the opener 5D in units of FOUPs.

[Replacing Operation of Two FOUPs F by FOUP Transportation Mechanism 62]

Next, a replacing operation of two FOUPs F by the two grippers 65A and 65B of the FOUP transportation mechanism 62 will be described. The FOUP F placed in each of the four openers 5A to 5D is replaced by another FOUP F. In this case, to transport FOUPs efficiently, the replacing operation is performed by using the two grippers 65A and 65B of the FOUP transportation mechanism 62. Conveyance except for the four openers 5A to 5D, such as FOUP transportation from the input port IP1 to the untreated substrate FOUP shelf IB1 is performed by using one of the two grippers 65A and 65B.

Figure 10A:
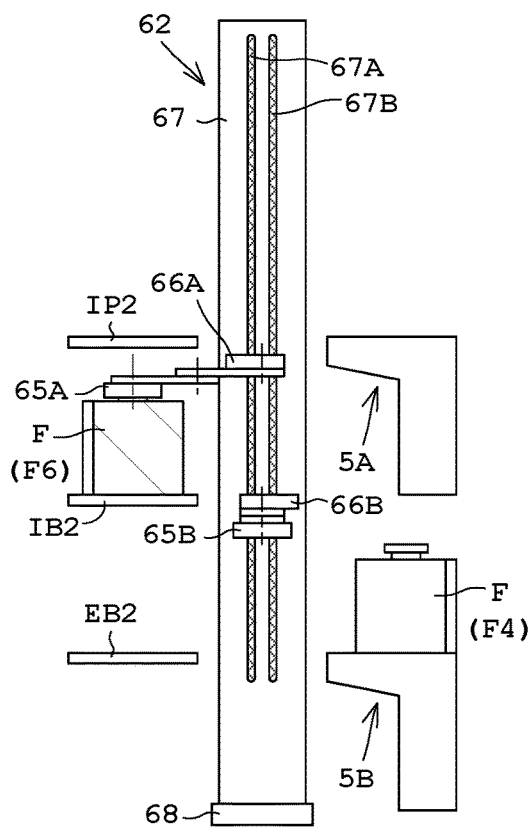
FIGS. 10A to 10D are illustrations for describing an operation of replacing two FOUPs by the FOUP transportation mechanism.

In FIG. 10A, the FOUP transportation mechanism 62 grasps an untreated FOUP F6 (indicated by hatching) placed on the untreated substrate FOUP shelf IB2 with the upper gripper 65A. Then, the FOUP transportation mechanism 62 moves the grasped untreated FOUP F6 to a transportation space between the untreated substrate FOUP shelf IB2 (shelves 61) and the four openers 5A to 5D, by using the articulated arm 66A and the driving unit 67A.

Figure 10B:
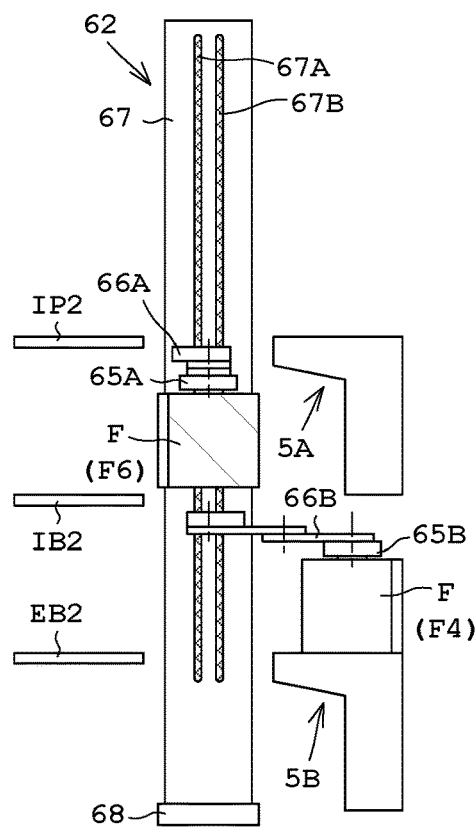

In FIG. 10B, the FOUP transportation mechanism 62 grasps the empty FOUP F4 placed on the opener 5B, by using the lower gripper 65B. Thereafter, the FOUP transportation mechanism 62 moves the grasped empty FOUP F4 from the opener 5B to the transportation space, by using the articulated arm 66B and the driving unit 67B. The upper gripper 65A has been moved to a position at which the untreated FOUP F6 does not collide with, for example, the lower gripper 65B.

Figure 10C:
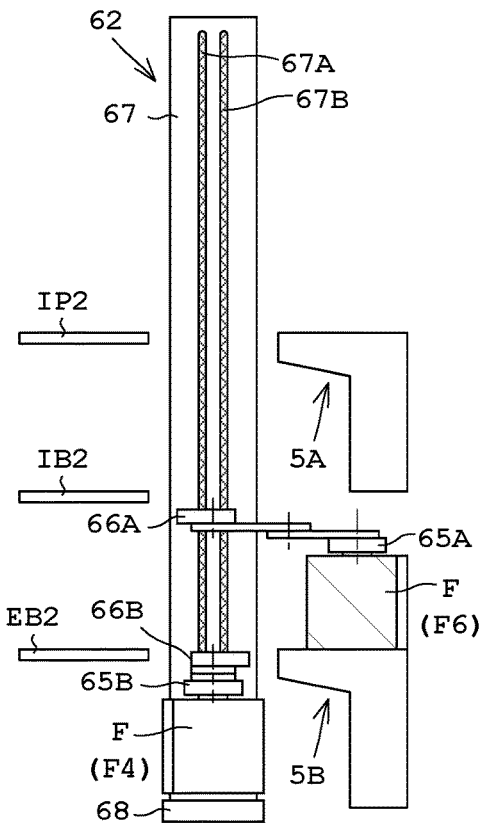

In FIG. 10C, the FOUP transportation mechanism 62 places the untreated FOUP F6 grasped by the upper gripper 65A on the opener 5B, instead of the empty FOUP F4. Subsequently, the FOUP transportation mechanism 62 cancels grasping by the upper gripper 65A. The upper gripper 65A is moved to the transportation space. The lower gripper 65B has been moved to a position at which the lower gripper 65B does not collide with the FOUP F6 grasped by the upper gripper 65A.

Figure 10D:
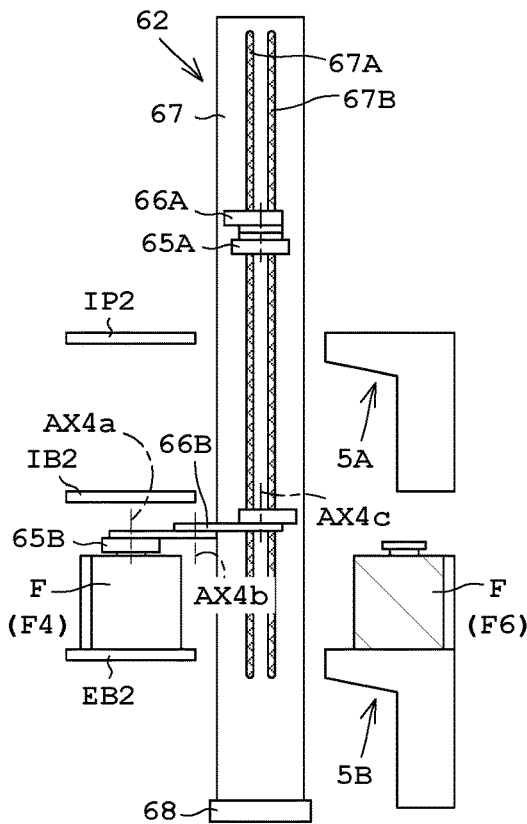

In FIG. 10D, the FOUP transportation mechanism 62 places the empty FOUP F4 grasped by the lower gripper 65B on, for example, an empty FOUP shelf EB2. Then, the FOUP transportation mechanism 62 cancels grasping by the lower gripper 65B. In this manner, FOUPs F can be efficiently transported by performing a replacing operation. In this description, the untreated FOUP F6 grasped by the upper gripper 65A, and the empty FOUP F4 is grasped by the lower gripper 65B. Alternatively, these FOUPs may be held in opposite manner. Specifically, the untreated FOUP F6 may be grasped by the lower gripper 65B with the empty FOUP F4 being grasped by the upper gripper 65A.

[Operation Example 1 of FOUP Buffer Device 4]

Figure 11:
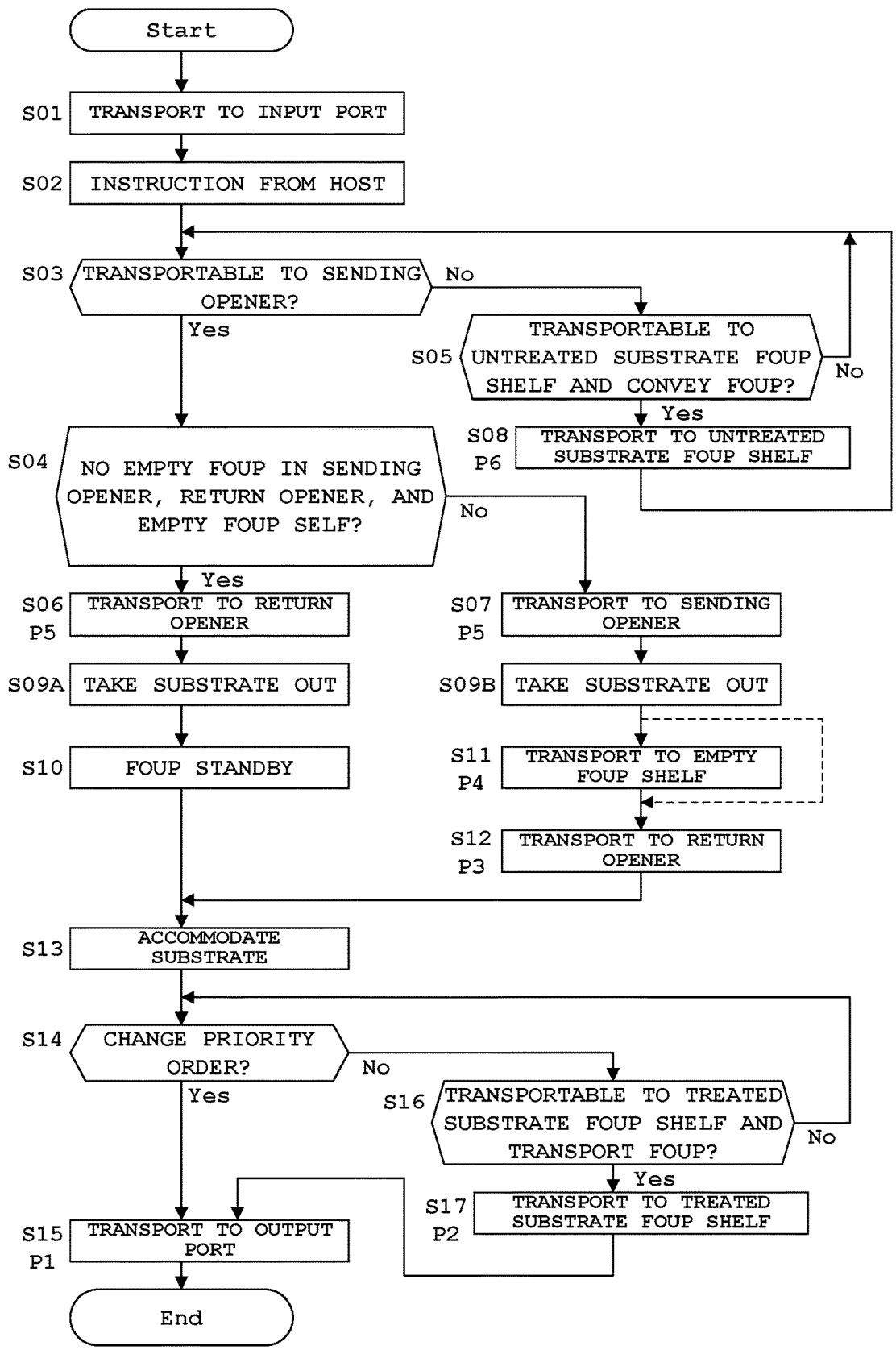
FIG. 11 is a flowchart for depicting a FOUP transportation and a substrate transportation from an input port to an output port.

Next, an operation of the FOUP buffer device 4 will be described with reference to a flowchart of FIG. 11. FIG. 11 is a flowchart for depicting a transportation of a FOUP F1 from an input port to an output port and a substrate transportation. The "FOUP F1" refers to a predetermined FOUP F. That is, description will be focused on the "FOUP F1" and FOUP transportation, for example, will be described using the "FOUP F1" as an example. In a case where a FOUP that is not the predetermined FOUP F1 will be represented as a "FOUP F." FIG. 12 is a table showing an operation priority order of the FOUP buffer device 4.

In the following description, an opener for taking substrates W will be referred to as a "sending opener" and an opener for accommodating substrates W will be referred to as "return opener."

The external transportation mechanism OHT transports the FOUP F1 to, for example, the input port IP1 (step S01). The substrate treating apparatus 1 receives an instruction to execute a treatment on a substrate W accommodated in the FOUP F1 from a host computer of a factory (step S02).

The control units 71 of the substrate treating apparatus 1 determines whether the FOUP F1 of the input port IP1 can be transported to one of the two sending openers 5A and 5B (step S03). In this determination, determination on whether the FOUP F is placed on each of the openers 5A and 5B is performed based on a current position of the FOUP F managed by schedule management software (scheduler) or information of, for example, an optical sensor placed on the mount table 12 of each of the sending openers 5A and 5B. Such a determination method is performed similarly to the case of the two return openers 5C and 5D and the shelves 61. The schedule management software is executed by the control units 71 of the substrate treating apparatus 1.

As a result of the determination, if the FOUP F1 can be transported to at least one of the two sending openers 5A and 5B, the process proceeds to step S04, and otherwise, the process proceeds to step S05.

In step S04, the control unit 71 further determines whether the current state satisfies all the conditions where the FOUP F is not placed on any of the sending openers 5A and 5B, where the FOUP F is not placed on at least one of the return openers 5C and 5D, and where FOUPs F (including an empty FOUP) are not placed on any of the four empty FOUP shelves EB1 to EB4 or not. As a result of determination, if all the conditions are satisfied (see, for example, FIGS. 13A, 13B, and 17C described later), the FOUP transportation mechanism 62 transports the FOUP F1 from the input port IP1 not to the sending openers 5A and 5B but to the transportable return opener (e.g., 5C) on which no FOUP F is placed (step S06). In accordance with the scheduler of the substrate treating apparatus 1 and the operation priority order of the FOUP buffer device 4 (see FIG. 12), it is previously set that the FOUP F1 is transported to the sending opener 5A (5B), and after all the substrates W are taken out, and the FOUP F1 is transported to the return opener 5C (5D).

As a result of the determination in step S04, if at least one of the conditions is not satisfied, the FOUP transportation mechanism 62 transports the FOUP F1 from the input port IP1 to one of the sending openers 5A and 5B to which the FOUP F1 can be transported (step S07).

On the other hand, in step S03, if other FOUPs F are placed on both of the sending openers 5A and 5B and the FOUP F1 cannot be transported, the control unit 71 determines whether the FOUP F1 can be transported to one of the two untreated substrate FOUP shelves IB1 and IB2 and whether to transport the FOUP F1 (step S05). Since other FOUPs F are placed on both of the two untreated substrate FOUP shelves IB1 and IB2, if the FOUP F1 cannot be transported to any of the shelves IB1 and IB2, the FOUP F1 is kept in a standby state in the input port IP1. If the control unit 71 determines not to transport the FOUP F1, the FOUP F1 is also kept in a standby state in the input port IP1. If the FOUP F1 can be transported and the control unit 71 determines to transport the FOUP F1, the FOUP transportation mechanism 62 transports the FOUP F1 to one of the two untreated substrate FOUP shelves IB1 and IB2 (step S08).

If the FOUP F1 is placed on one of the return openers 5C and 5D, in step S09A, a substrate W is taken from the FOUP F1 and is transported to the substrate buffer unit 7. In general, the two return openers 5C and 5D are used for accommodating substrates W in a FOUP F. However, in a case where substrates W can be smoothly transported (conditions in step S04 are satisfied), substrates W yet to be treated are taken from an untreated substrate FOUP F placed on one of the return openers 5C and 5D. Accordingly, until all the treated substrates W are accommodated, the FOUP F1 placed on the opener 5C is not moved and can be kept, for example, (step S10). Thus, the FOUP transportation mechanism 62 can transport other FOUPs F, transportation efficiency of FOUPs F can be enhanced.

On the other hand, if the FOUP F1 is placed on one of the sending openers 5A and 5B, in step S09B, a substrate W is taken from the FOUP F1 and is transported to the substrate buffer unit 7. After the first substrate transportation mechanism 6A has taken all the substrates W from the FOUP F1, the empty FOUP F1 is transported from the sending opener 5A to one of the four empty FOUP shelves EB1 to EB4 (step S11). For example, at the time when the first substrate W treated in the treating block 3 returns to the substrate buffer unit 7, the FOUP F1 is transported from one of the four empty FOUP shelves EB1 to EB4 to one of the two return openers 5C and 5D to which the FOUP F1 can be transported (step S12). The FOUP F1 that has become empty in step S09B may be directly transported to one of the return openers 5C and 5D without interposition of the four empty FOUP shelves EB1 to EB4.

In step S13, the second substrate transportation mechanism 6B accommodates the treated substrate W in the empty FOUP F1 placed on the return opener 5C, for example. That is, the treated substrate W returned to the substrate buffer unit 7 is transported to the empty FOUP F1. In a case where all the substrates W are accommodated in the empty FOUP F1, if an output instruction is previously issued from the host computer (if an operation priority order of first-in first-out (FIFO) is changed), the FOUP F1 accommodating the treated substrate W is transported to one of the two output ports OP1 and OP2 (steps S14 and S15).

If no output instruction is issued from the host computer, the control unit 71 determines whether the FOUP F1 can be transported to one of the two treated substrate FOUP shelves OB1 and OB2 and whether to transport the FOUP F1 (step S16). If the FOUP F1 cannot be transported or if the control unit 71 determines not to transport the FOUP F1, the FOUP F1 is kept in the return opener 5C, whereas if the FOUP F1 can be transported and the control unit 71 determines to transport the FOUP F1, the FOUP transportation mechanism 62 transports the FOUP F1 from the return opener 5C to one of the two treated substrate FOUP shelves OB1 and OB2 (step S17).

The FOUP F1 transported to the treated substrate FOUP shelf OB1 (OB2) is transported to one of the two output ports OP1 and OP2 in accordance with the operation priority order of FIFO (step S15). The FOUP F1 transported to the output port OP1 (OP2) is transported from the output port OP1 (OP2) to a next device by the external transportation mechanism OHT.

FIG. 12 is a table showing an operation priority order of the FOUP buffer device 4. As shown in FIG. 12, a downstream return operation is performed with priority to an upstream sending operation. Characters P1 to P6 in FIG. 11 respectively correspond to priorities 1 to 6 in FIG. 12. The order of starting a treatment on a FOUP F (priority order) and the order of output from the apparatus 1 are determined based on an instruction from the host computer, and are basically determined in accordance with first-in first-out (FIFO). The operation priority order shown FIG. 12 is applied to a case where the FOUP transportation mechanism 62 includes only one gripper, or a case where the FOUP transportation mechanism 62 includes a plurality of grippers but one gripper is used to transport a FOUP F without the replacing operation by the two grippers 65A and 65B described above. Thus, in the case of the replacing operation by the four openers 5A to 5D as described in this embodiment, the priority order is reversed, for example, and the operation priority order shown in FIG. 12 is not applied.

[Operation Example 2 of FOUP Buffer Device 4]

Next, an operation example in the case of transporting a plurality of FOUPs F will be described. In this transportation, the operation of the flowchart shown in FIG. 11 is applied, and the operation priority order shown in FIG. 12 is partially applied.

The external transportation mechanism OHT sequentially supplies a plurality of FOUPs F. The external transportation mechanism OHT transports the FOUPs F to one of the two input ports IP1 and IP2 except for a case where the FOUPs F cannot be transported to any of the two input ports IP1 and IP2. The FOUPs F are numbered in the order of transportation from the external transportation mechanism OHT to one of the input ports IP1 and IP2. For example, the second FOUP F is represented as "F2," and the fifth FOUP F is represented as "F5." In FIGS. 13A to 13D, for example, the FOUP F1 is represented as "1," for example, for convenience of illustration.

Figure 13A:
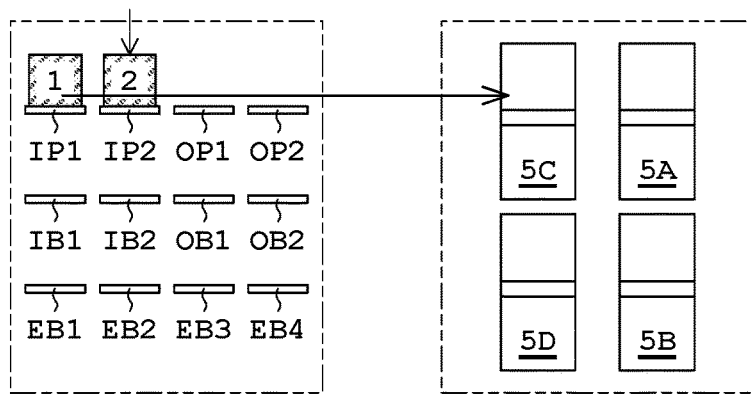
FIGS. 13A to 13D are illustrations for describing a FOUP transportation.

In FIG. 13A, the FOUP F1 is transported to the input port IP1, and the FOUP F2 is transported to the input port IP2. The FOUP transportation mechanism 62 transports the FOUP F1 from the input port IP1 to the return opener 5C (priority 5).

Figure 13B:
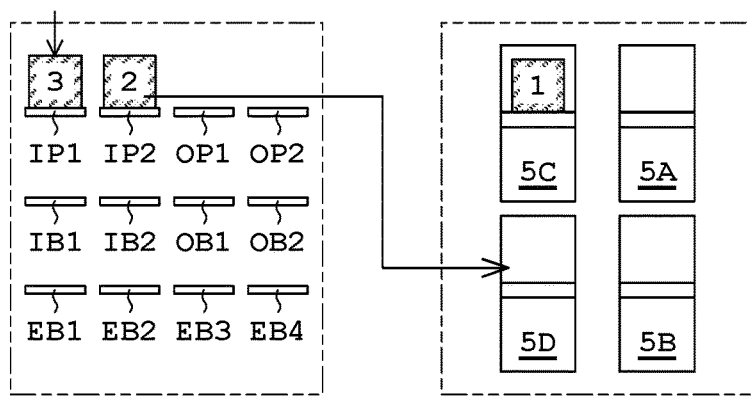

In FIG. 13B, the FOUP transportation mechanism 62 transports the FOUP F2 from the input port IP2 to the return opener 5D (priority 5). The input port IP1 receives the FOUP F3 from the external transportation mechanism OHT. The second substrate transportation mechanism 6B starts taking a substrate W from the FOUP F1 placed on the return opener 5C. Conveyance of substrates W is performed in parallel with transportation of FOUPs F.

Figure 13C:
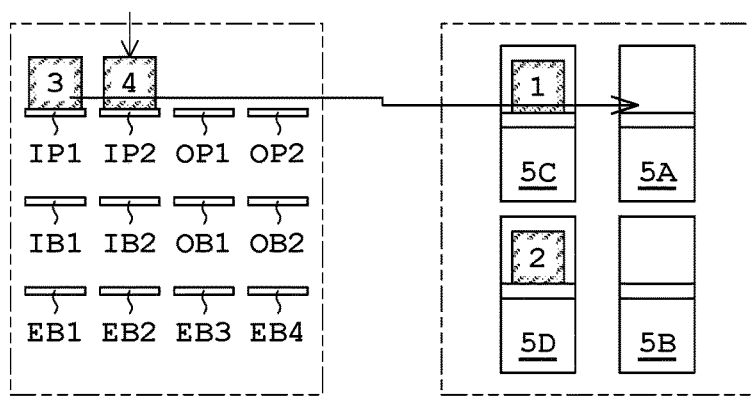

In FIG. 13C, the FOUP transportation mechanism 62 transports the FOUP F3 from the input port IP1 to the sending opener 5A (priority 5). The input port IP2 receives the FOUP F4 from the external transportation mechanism OHT. The second substrate transportation mechanism 6B continues to take substrates W from the FOUP F1 placed on the return opener 5C. Since the second substrate transportation mechanism 6B is taking the substrates W from the FOUP F1, the FOUP F2 waits for being taken out.

Figure 13D:
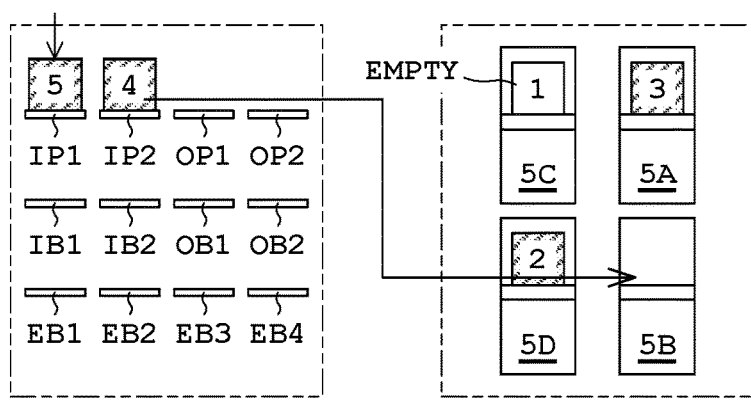

In FIG. 13D, the FOUP transportation mechanism 62 transports the FOUP F4 from the input port IP2 to the sending opener 5B (priority 5). The input port IP1 receives the FOUP F5 from the external transportation mechanism OHT. The second substrate transportation mechanism 6B finishes taking all the substrates W from the FOUP F1 placed on the return opener 5C. Thereafter, the second substrate transportation mechanism 6B starts taking substrates W from the FOUP F2 placed on the return opener 5D. It is known (calculated) by the schedule management software executed by the control unit 71 that substrates W accommodated in the FOUP F1 placed on the return opener 5C return to the substrate buffer unit 7 first after treatment by the treating block 3. Thus, the empty FOUP F1 from which all the substrates W have been taken is kept on the return opener 5C.

A treatment is to be performed by the treating block 3 in the order of the "FOUP F1" the "FOUP F2," the "FOUP F3," and the "FOUP F4." The second substrate transportation mechanism 6B is being taking substrates W from the FOUP F2. Thus, the FOUP F3 waits for being taken out.

Figure 14A:
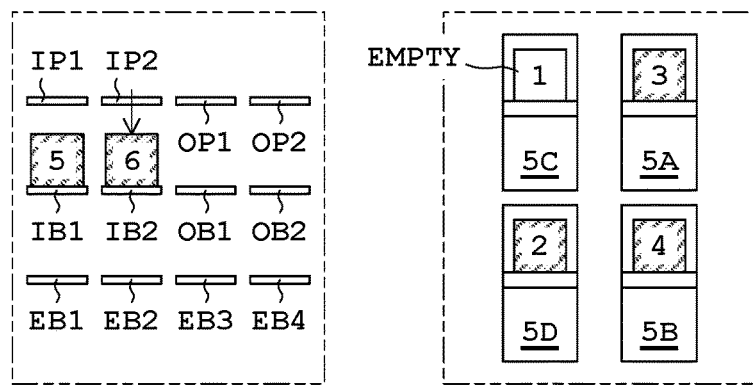
FIGS. 14A to 14D are illustrations for describing a FOUP transportation subsequent to the process illustrated in FIG. 13D.

In FIG. 14A, since the four openers 5A to 5D are filled with the four FOUPs F1 to F4, the FOUP transportation mechanism 62 transports the FOUP F5 from the input port IP1 to the untreated substrate FOUP shelf IB1 (priority 6). For the same reason, after the input port IP2 has received the FOUP F6 from the external transportation mechanism OHT, the FOUP transportation mechanism 62 transports the FOUP F6 from the input port IP2 to the untreated substrate FOUP shelf IB2 (priority 6).

Figure 14B:
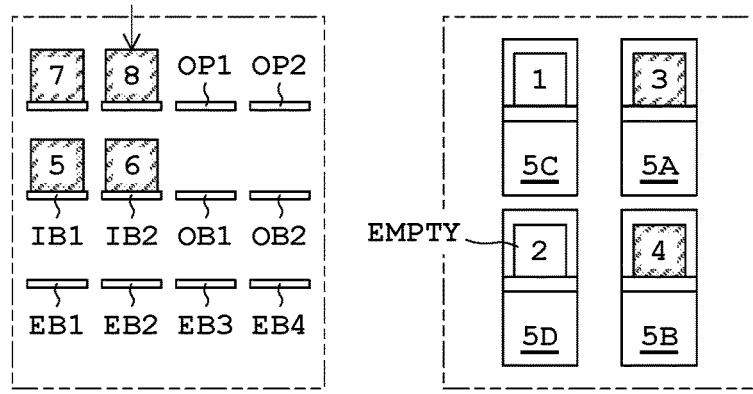

In FIG. 14B, the two input ports IP1 and IP2 receive FOUPs F7 and F8 from the external transportation mechanism OHT. The four openers 5A to 5D and the two untreated substrate FOUP shelves IB1 and IB2 are filled with six FOUPs F1 to F6. Thus, the FOUP buffer device 4 does not accommodate FOUPs F anymore. Accordingly, the external transportation mechanism OHT stops supply of FOUPs F until one of the two input ports IP1 and IP2 becomes capable of transporting FOUPs.

The second substrate transportation mechanism 6B finishes taking all the substrates W from the FOUP F2 placed on the return opener 5D. Thereafter, the first substrate transportation mechanism 6A starts taking substrates W from the FOUP F3 placed on the sending opener 5A. It is known by the schedule management software executed by the control unit 71 that substrates W accommodated in the FOUP F2 placed on the return opener 5D return to the substrate buffer unit 7 secondly after treatment by the treating block 3. Thus, the empty FOUP F2 from which all the substrates W have been taken is kept on the return opener 5D.

Figure 14C:
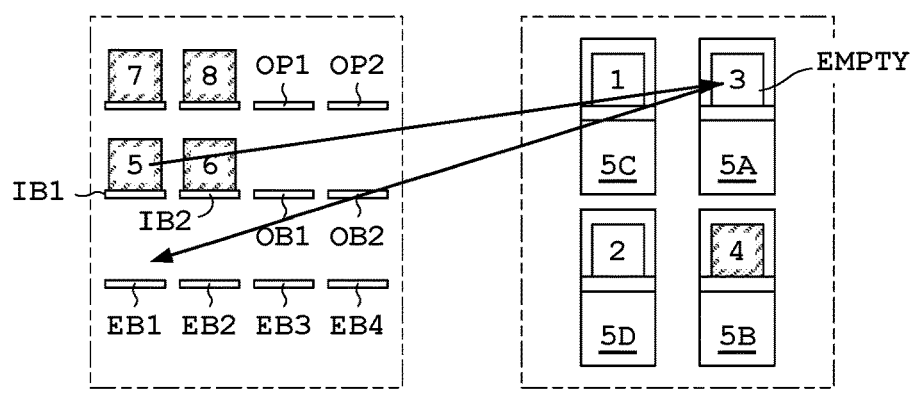

In FIG. 14C, the first substrate transportation mechanism 6A finishes taking all the substrates W from the FOUP F3 placed on the sending opener 5A. Thereafter, the first substrate transportation mechanism 6A starts taking substrates W from the FOUP F4 placed on the sending opener 5B. To perform a treatment continuously, the substrate treating apparatus 1 transports an empty FOUP F3 from the sending opener 5A to the empty FOUP shelf EB1, and a FOUP F5 placed on the untreated substrate FOUP shelf IB1 to the sending opener 5A.

First, the FOUP transportation mechanism 62 grasps the FOUP F5 on the untreated substrate FOUP shelf IB1 with the upper gripper 65A and moves the FOUP F5 from the untreated substrate FOUP shelf IB1. The lower gripper 65B does not grasp the FOUP F. Thereafter, the FOUP transportation mechanism 62 replaces the empty FOUP F3 by the FOUP F5 in the sending opener 5A. Specifically, the FOUP transportation mechanism 62 grasps the empty FOUP F3 in the sending opener 5A with the lower gripper 65B, and moves the FOUP F3 from the sending opener 5A. Thereafter, the FOUP transportation mechanism 62 places the FOUP F5 on the sending opener 5A with the upper gripper 65A. After having placed the FOUP F5, the FOUP transportation mechanism 62 places the empty FOUP F3 on the empty FOUP shelf EB1 with the lower gripper 65B.

Figure 14D:
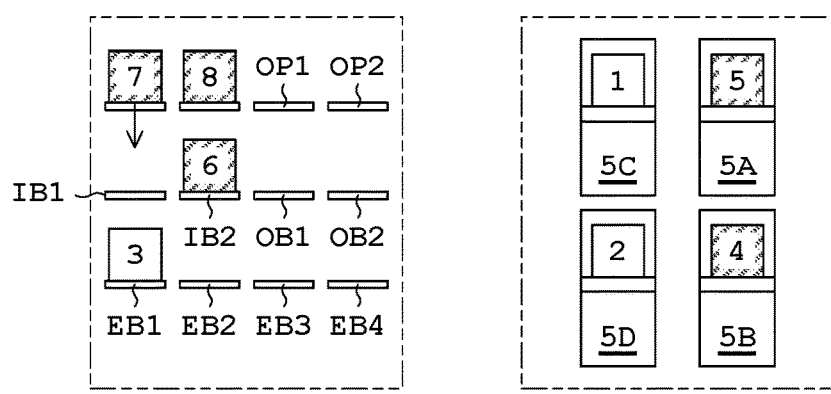

In FIG. 14D, since the two sending openers 5A and 5B are filled with the two FOUPs F5 and F4, the FOUP transportation mechanism 62 transports the FOUP F7 from the input port IP1 to the untreated substrate FOUP shelf IB1 (priority 6).

Figure 15A:
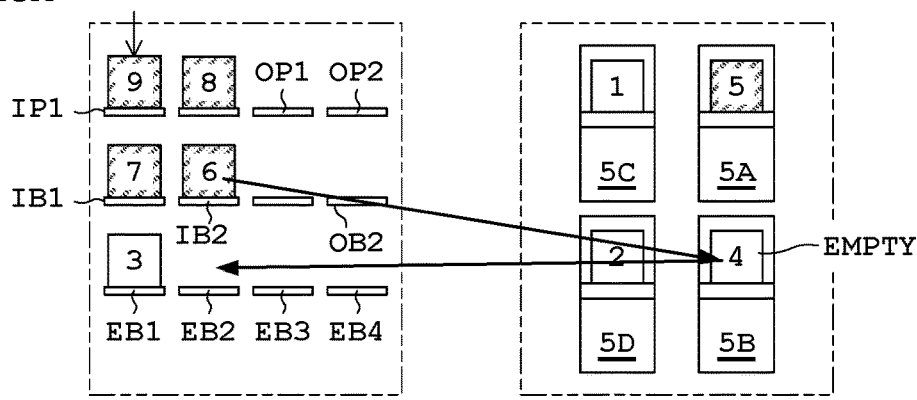
FIGS. 15A to 15D are illustrations for describing a FOUP transportation subsequent to the process illustrated in FIG. 14D.

In FIG. 15A, the first substrate transportation mechanism 6A finishes taking all the substrates W from the FOUP F4 placed on the sending opener 5B. Thereafter, the first substrate transportation mechanism 6A starts taking substrates W from the FOUP F5 placed on the sending opener 5A. To perform a treatment continuously, the substrate treating apparatus 1 transports the empty FOUP F4 from the sending opener 5B to the empty FOUP shelf EB2, and the FOUP F6 placed on the untreated substrate FOUP shelf IB2 to the sending opener 5D.

First, the FOUP transportation mechanism 62 grasps the FOUP F6 on the untreated substrate FOUP shelf IB2 with the upper gripper 65A and moves the FOUP F6 from the untreated substrate FOUP shelf IB2. The lower gripper 65B does not grasp any FOUP F. Thereafter, the FOUP transportation mechanism 62 replaces the empty FOUP F4 by the FOUP F6 in the sending opener 5B. Specifically, the FOUP transportation mechanism 62 grasps the empty FOUP F4 in the sending opener 5B with the lower gripper 65B, and moves the FOUP F4 from the sending opener 5B. Thereafter, the FOUP transportation mechanism 62 places the FOUP F6 on the sending opener 5B with the upper gripper 65A. After having placed the FOUP F6, the FOUP transportation mechanism 62 places the empty FOUP F4 on the empty FOUP shelf EB2 with the lower gripper 65B.

Figure 15B:
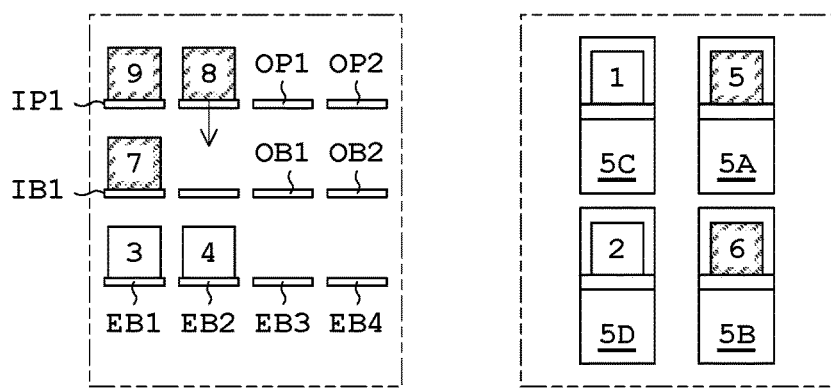

In FIG. 15B, since the two sending openers 5A and 5B are filled with the two FOUPs F5 and F6, the FOUP transportation mechanism 62 transports the FOUP F8 from the input port IP2 to the untreated substrate FOUP shelf IB2 (priority 6).

Figure 15C:
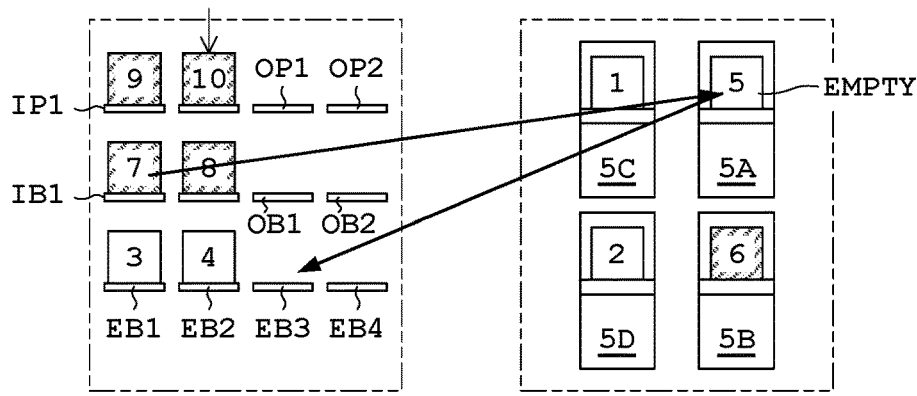

In FIG. 15C, the first substrate transportation mechanism 6A finishes taking all the substrates W from the FOUP F5 placed on the sending opener 5A. Thereafter, the first substrate transportation mechanism 6A starts taking substrates W from the FOUP F6 placed on the sending opener 5B. The FOUP transportation mechanism 62 transports the empty FOUP F5 to the empty FOUP shelf EB3.

First, the FOUP transportation mechanism 62 grasps the FOUP F7 on the untreated substrate FOUP shelf IB1 with the upper gripper 65A and moves the FOUP F7 from the untreated substrate FOUP shelf IB1. The lower gripper 65B does not hold any FOUP F. Thereafter, the FOUP transportation mechanism 62 replaces the empty FOUP F5 by the FOUP F7 in the sending opener 5A. Specifically, the FOUP transportation mechanism 62 grasps the empty FOUP F5 in the sending opener 5A with the lower gripper 65B, and moves the FOUP F5 from the sending opener 5A. Thereafter, the FOUP transportation mechanism 62 places the FOUP F7 on the sending opener 5A with the upper gripper 65A. After having placed the FOUP F7, the FOUP transportation mechanism 62 places the empty FOUP F5 on the empty FOUP shelf EB3 with the lower gripper 65B. The input port IP2 receives the FOUP F10 from the external transportation mechanism OHT.

In FIG. 13D, taking of all the substrates W from the FOUP F1 is finished. The taken substrates W are sent to the treating block 3 through the substrate buffer unit 7. The treating block 3 performs a predetermined treatment on the substrates W. The treated substrates W subjected to the predetermined treatment by the treating block 3 are returned to the substrate buffer unit 7 by the third substrate transportation mechanism 33. The second substrate transportation mechanism 6B accommodates the substrates W returned to the substrate buffer unit 7 in the FOUP F1.

Figure 15D:
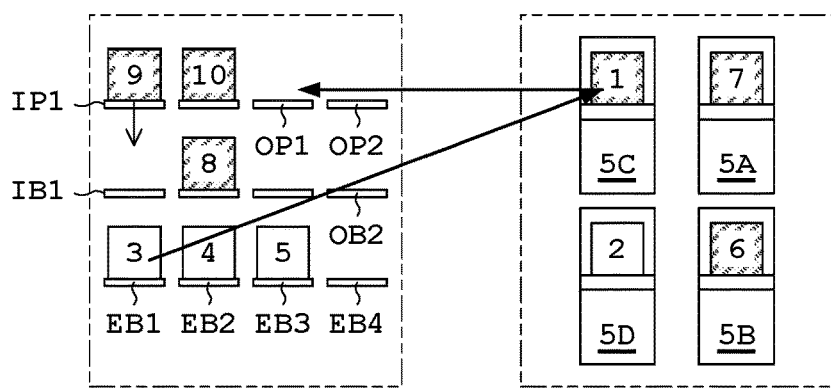

In FIG. 15D, the second substrate transportation mechanism 6B accommodates all the treated substrates W in the FOUP F1 placed on the return opener 5C. The second substrate transportation mechanism 6B starts accommodating substrates W in the FOUP F2 placed on the return opener 5D. Subsequently, if all the treated substrates W are accommodated in the FOUP F2 placed on the return opener 5D, accommodating of the treated substrates W in the FOUP F3 placed on the return opener 5C stats.

The FOUP transportation mechanism 62 transports the treated FOUP F1 to the output port OP1. First, the FOUP transportation mechanism 62 grasps the empty FOUP F3 placed on the empty FOUP shelf EB1 with the upper gripper 65A and moves the empty FOUP F3 from the empty FOUP shelf EB1. The lower gripper 65B does not hold any FOUP F. Thereafter, in the return opener 5C, the FOUP transportation mechanism 62 replaces the FOUP F1 accommodating treated substrates W by the empty FOUP F3. Specifically, the FOUP transportation mechanism 62 grasps the FOUP F1 of the return opener 5C with the lower gripper 65B and moves the FOUP F1 from the return opener 5C. Thereafter, the FOUP transportation mechanism 62 places the FOUP F3 on the sending opener 5C with the upper gripper 65A. After having placed the empty FOUP F3, the FOUP transportation mechanism 62 places the treated FOUP F1 on the output port OP1 with the lower gripper 65B.

Since the two sending openers 5A and 5B are filled with the two FOUPs F7 and F6, the FOUP transportation mechanism 62 transports the FOUP F9 from the input port IP1 to the untreated substrate FOUP shelf IB1 (priority 6).

Figure 16:
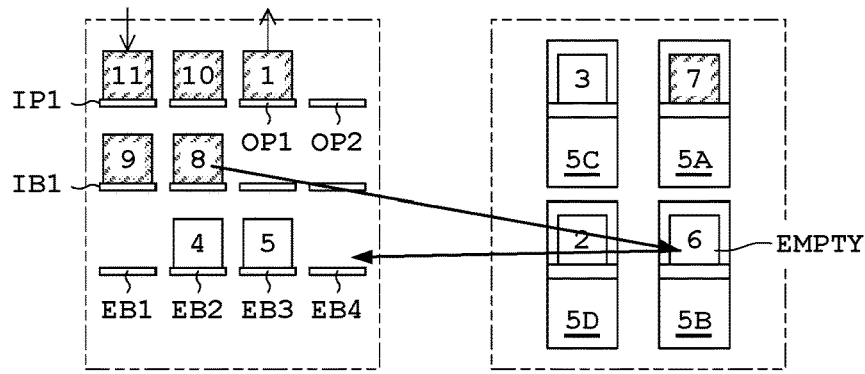
FIG. 16 is an illustration for describing a FOUP transportation subsequent to the process illustrated in FIG. 15D.

In FIG. 16, the FOUP F1 placed on the output port OP1 is transported by the external transportation mechanism OHT from the output port OP1.

Figure 17A:
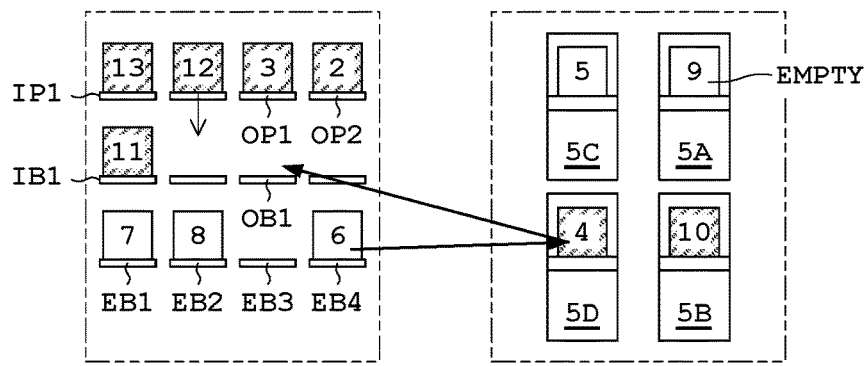
FIGS. 17A to 17C are illustrations for describing another FOUP transportation.

In FIG. 17A showing a state after FIG. 16, if the FOUP F4 accommodating treated substrates W cannot be transported to any of the two output ports OP1 and OP2, the FOUP transportation mechanism 62 transports the FOUP F4 from the return opener 5D to one of the two treated substrate FOUP shelves OB1 and OB2 (e.g., OB1). In this case, to transport FOUPs efficiently, the FOUP transportation mechanism 62 replaces the FOUP F4 by the empty FOUP F6 with the two grippers 65A and 65B in the return opener 5D.

Figure 17B:
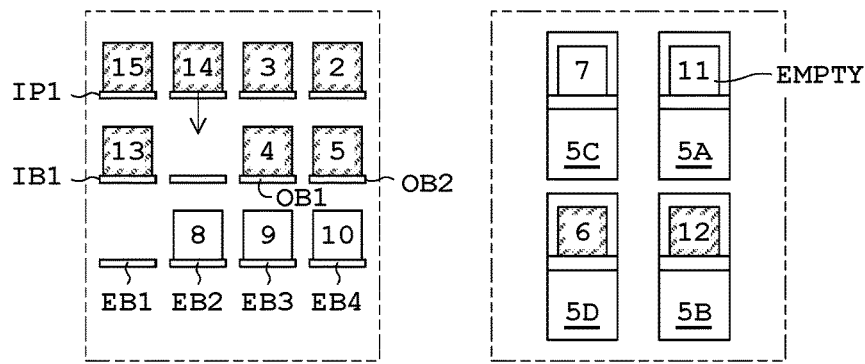

In addition, in FIG. 17B showing a state after FIG. 17A, if the FOUP F6 accommodating treated substrates W cannot be transported to any of the two output ports OP1 and OP2 and the two treated substrate FOUP shelves OB1 and OB2, the FOUP F6 cannot be transported anymore. Thus, until one of the two treated substrate FOUP shelves OB1 and OB2 becomes empty or until one of the two output ports OP1 and OP2 becomes empty and higher priority is given than FOUPs F4 and F5, the FOUP F6 is kept in a standby state in the return opener 5D.

Figure 17C:
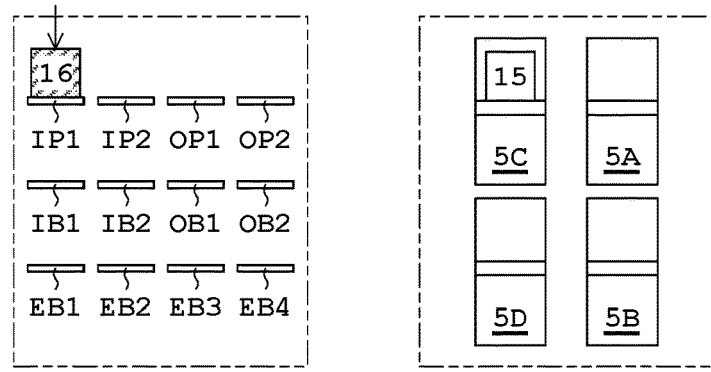

Furthermore, when a time has elapsed from the state shown in FIG. 17B and the input port IP1 receives the FOUP F16, transportation of the FOUP F16 not to the sending openers 5A and 5B but to the return opener 5D enhances efficiency in transporting FOUPs. That is, as shown in FIG. 17C, if the current state satisfies all the conditions where no FOUP F is placed on any of the two sending openers 5A and 5B, where the FOUP F is not placed on one of the two return openers 5C and 5D, and where the FOUP F is not placed on any of the four empty FOUP shelves EB1 to EB4, the FOUP transportation mechanism 62 transports the FOUP F16 to one of the two return openers 5C and 5D (return opener 5D in FIG. 17C) on which no FOUP is placed. In this case, after all the treated substrates W are accommodated in the FOUP F15 placed on the return opener 5C, taking substrates W from the return opener 5D starts.

In this embodiment, each of the first substrate transportation mechanism 6A and the second substrate transportation mechanism 6B transports substrates W for FOUPs F placed on, for example, the two openers 5A and 5B placed in the upward/downward direction, not to the two openers 5A and 5C disposed in the lateral direction. Accordingly, even when the number of openers is increased, the hands 21 capable of moving forward and backward is not slidably moved in the lateral direction, and substrates W are transported by lifting and lowering and rotation. Thus, transportation of the substrates W can be simplified. Accordingly, standby time of substrate transportation can be reduced, and a decrease in substrate transportation efficiency can be prevented. As a result, a throughput of substrate treatment can be enhanced.

The first substrate transportation mechanism 6A takes all the substrates from a FOUP F placed on, for example, the opener 5A in the first opener line 9, and then, a substrate W is taken from another FOUP F placed on the opener 5B in the first opener line 9. After having accommodated all the substrates in the FOUP F placed on the opener 5C in the second opener line 10, the second substrate transportation mechanism 6B accommodates a substrate W in another FOUP F placed on the opener 5D in the second opener line 10.

Accordingly, after having taken all the substrates W from the FOUP F, the first substrate transportation mechanism 6A can take substrates W from another FOUP F. The second substrate transportation mechanism 6B can accommodate all the substrates W in a FOUP F and then accommodate substrates W in another FOUP F.

The substrate treating apparatus 1 includes the FOUP transportation mechanism 62 that transports FOUPs F. The FOUP transportation mechanism 62 is disposed at the side opposite to the first substrate transportation mechanism 6A and the second substrate transportation mechanism 6B with the first opener line 9 and the second opener line 10 sandwiched therebetween. The FOUP transportation mechanism 62 replaces the FOUP F from which all the substrates W have been taken by the first substrate transportation mechanism 6A, by another FOUP F accommodating substrates W. The FOUP transportation mechanism 62 replaces the FOUP F caused to accommodate all the substrates W by the second substrate transportation mechanism 6B, by another FOUP F (empty FOUP) accommodating no substrates W.

For example, if two openers 5C and 5D are disposed in the upward/downward direction, a hand of an operator cannot reach the upper opener 5C, for example, and thus, the operator has difficulty in replacing FOUPs F for the upper opener 5C in some cases. However, in this embodiment, since the FOUP transportation mechanism 62 transports FOUPs F, the FOUPs F can be easily transported. In addition, since the FOUP F from which all the substrates W have been taken is replaced by another FOUP F accommodating substrates W, a larger number of untreated substrates W can be supplied to the substrate treating apparatus 1. Furthermore, since the FOUP F accommodating all the substrates W is replaced by another FOUP F (empty FOUP) accommodating no substrates W, a larger number of treated substrates W subjected to a treatment by the treating block 3 can be returned to the FOUP F.

The FOUP buffer device 4 includes the four empty FOUP shelves EB1 to EB4 on which empty FOUPs F can be placed. If the current state satisfies all the conditions where the FOUP F is placed on any of the two openers 5A and 5B in the first opener line 9, where the FOUP F is not placed on at least one of the two openers 5C and 5D in the second opener line 10, and where the FOUP F is not placed on any of the four empty FOUP shelves EB1 to EB4, the FOUP transportation mechanism 62 transports a specific FOUP F to, for example, the opener 5C on which no FOUP F is placed in the second opener line 10. The second substrate transportation mechanism 6B takes substrates W from the specific FOUP F, and then, accommodates treated substrates W treated by the treating block 3 in the specific FOUP F. The FOUP transportation mechanism 62 allows the specific FOUP F to remain at a placement position of the specific FOUP F (opener 5C) from when all the substrates W are taken from the specific FOUP F by the second substrate transportation mechanism 6B to when all the treated substrates W are accommodated in the specific FOUP F.

In general, the second substrate transportation mechanism 6B is configured to accommodate substrates W in a FOUP F placed on, for example, the opener 5C in the second opener line 10. However, if a predetermined condition is satisfied, the second substrate transportation mechanism 6B takes substrates W from the specific FOUP F and then accommodates treated substrates W in the specific FOUP F. That is, the second substrate transportation mechanism 6B performs an operation different from a general substrate transportation. Accordingly, the specific FOUP F is allowed to remain at a placement position (e.g., the return opener 5C) from when all the substrates W are taken from the specific FOUP F to when all the substrates W are accommodated. Thus, the FOUP transportation mechanism 62 can transport FOUPs F except for the specific FOUP F, and thus, efficiency in transporting FOUPs F can be enhanced. Consequently, a wait time for transportation of FOUPs F is reduced so that throughput of substrate treatment can be enhanced.

The present invention is not limited to the embodiment described above, and may be modified as described below.

(1) In the embodiment described above, each of the first substrate transportation mechanism 6A, the second substrate transportation mechanism 6B, and the third substrate transportation mechanism 33 of the treating block 3 may perform substrate transportation individually while incorporating an action of causing the hands thereof to enter the substrate buffer unit 7 at the same time. In the substrate transportation of each of the first substrate transportation mechanism 6A, the second substrate transportation mechanism 6B, and the third substrate transportation mechanism 33 of the treating block 3, hands 21 and 41 thereof enter at the same time to place the substrates W and receive substrates W. Accordingly, it is unnecessary to wait for a time in which other hands enter the substrate buffer unit 7 and move backward, and thus, transportation efficiency of substrates W can be enhanced. As a result, throughput of substrate treatment can be enhanced.

That is, in substrate transportation of the first substrate transportation mechanism 6A, the second substrate transportation mechanism 6B, and the third substrate transportation mechanism 33, the two hands 21 of the first substrate transportation mechanism 6A, the two hands 21 of the second substrate transportation mechanism 6B, and the one hand 41 of the third substrate transportation mechanism 33 may enter the substrate buffer unit 7 at the same time in some cases. All these hands 21 and 41 do not always enter at the same time.

Figure 18A:
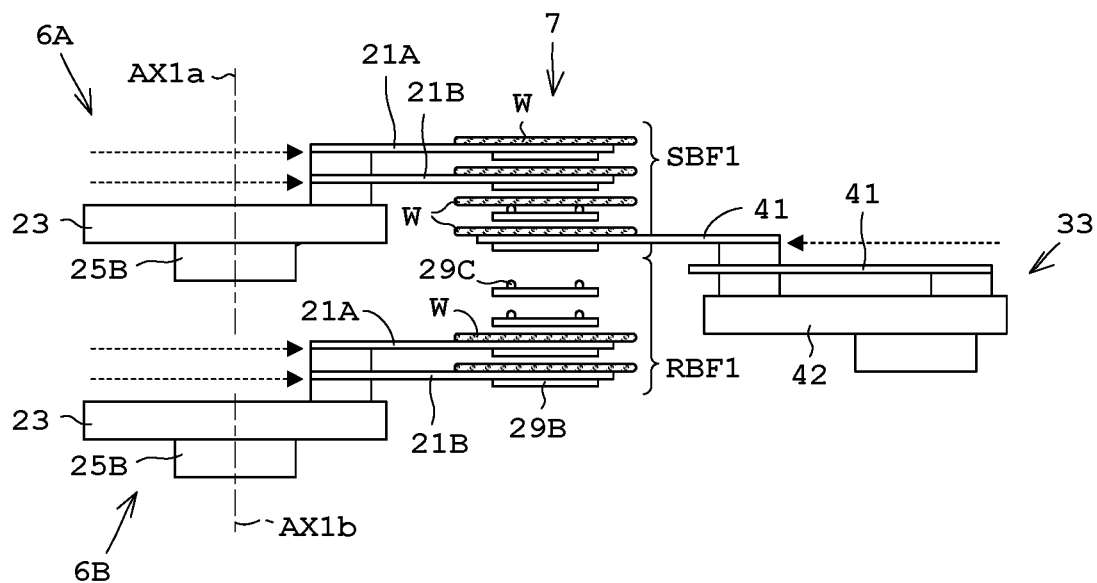
FIGS. 18A and 18B are illustrations for describing operations in which hands of the first substrate transportation mechanism, the second substrate transportation mechanism, and a third substrate transportation mechanism enter the substrate buffer unit at the same time.

In FIG. 18A, supposing the two hands 21A and 21B of the first substrate transportation mechanism 6A have entered the substrate buffer unit 7 in order to transport two substrates W to the sending buffer unit SBF1, for example. At the same time, to transport two substrates W from the return buffer unit RBF1, the two hands 21A and 21B of the second substrate transportation mechanism 6B may enter the substrate buffer unit 7. To transport (receive) one substrate W from the sending buffer unit SBF1, one hand 41 of the third substrate transportation mechanism 33 may enter the substrate buffer unit 7.

Figure 18B:
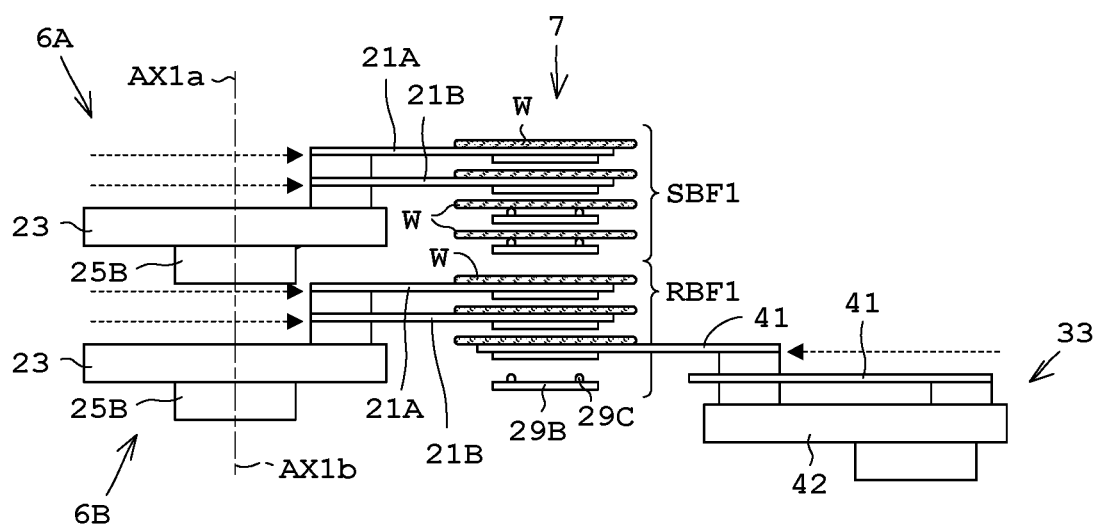

Similarly, in FIG. 18B, supposing the two hands 21A and 21B of the first substrate transportation mechanism 6A have entered the substrate buffer unit 7 in order to transport two substrates W to the sending buffer unit SBF1, for example. At the same time, to transport two substrates W from the return buffer unit RBF1, the two hands 21A and 21B of the second substrate transportation mechanism 6B may enter the substrate buffer unit 7. To transport (deliver) one substrate W to the return buffer unit RBF1, one hand 41 of the third substrate transportation mechanism 33 may enter the substrate buffer unit 7.

In FIG. 1, the four hands 41 of the four third substrate transportation mechanisms in addition to the two hands 21 (see FIG. 2) of the first substrate transportation mechanism 6A and the two hands 21 of the second substrate transportation mechanism 6B (i.e., eight hands in total) may enter the substrate buffer unit 7 at the same time. For example, based on positional information of forward/rearward driving units 23 and 42, the control unit 71 performs control such that the hands 21 and 41 do not interfere with each other.

(2) In the embodiment and the modification (1) described above, the treating block 3 includes the four coating-treatment layers 31A to 31D, but may include two or more coating-treatment layers. The treating block 3 may include four development-treatment layers for development by supplying a developer to substrates W, instead of the four coating-treatment layers 31A to 31D.

Figure 19:
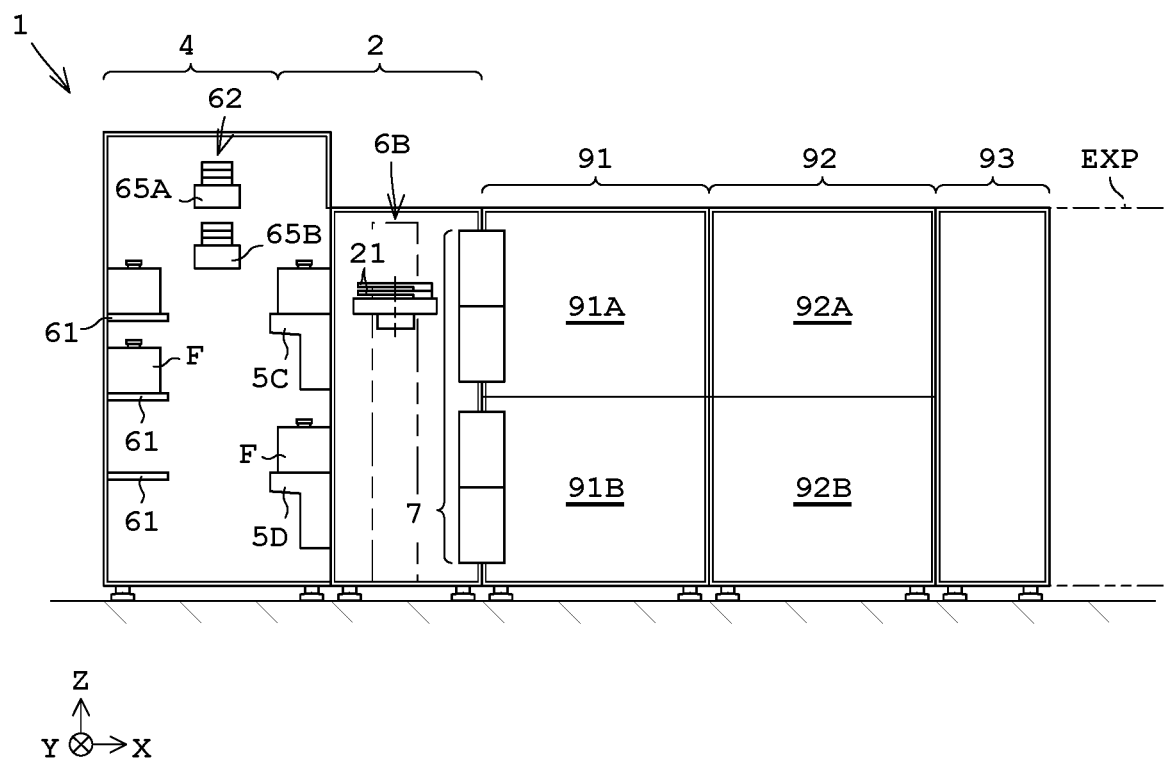
FIG. 19 is a side view of a substrate treating apparatus according to a variation.

(3) In the embodiment and the variations described above, the substrate treating apparatus 1 includes the treating block 3 including the four coating-treatment layers 31A to 31D. In this regard, as illustrated in FIG. 19, for example, the substrate treating apparatus 1 may include a coating block 91, a development block 92, and an interface block 93.

The coating block 91 includes two coating-treatment layers 91A and 91B. Each of the two coating-treatment layers 91A and 91B includes one third substrate transportation device and 2 lines×2 levels of coating-treatment units SC, and 3 lines×5 levels of heat-treatment units. The development block 92 includes two development-treatment layers 92A and 92B. Each of the two development-treatment layers 92A and 92B includes one third substrate transportation device, 2 lines×2 levels of development-treatment units SC, and 3 lines×5 levels of heat-treatment units. The interface block 93 includes two substrate transportation mechanisms, a plurality of heat-treatment units, and a plurality of cleaning-treatment units. The interface block 93 sends and receives substrates W to/from an external light-exposure apparatus EXP. The layout of the coating block 91 and the development block 92 may be inverted.

(4) In the embodiment and the modifications described above, the first opener line 9 includes the two openers 5A and 5B, and the second opener line 10 includes the two openers 5C and 5D. In this regard, each of the first opener line 9 and the second opener line 10 may include three or more openers. In this case, the shutter 16 may move in the rightward/leftward direction (Y-direction) without moving in the upward/downward direction. Accordingly, even if three or more openers are arranged in the upward/downward direction, the height of the indexer block can be reduced.

For example, supposing the first opener line 9 includes three openers 5A, 5B, and 5E. In this case, the first substrate transportation mechanism 6A may take substrates W in units of FOUPs cyclically in the order of the "opener 5A," the "opener 5B," and the "opener 5E."

(5) In the embodiment and the modifications described above, the two openers 5A and 5B are used as sending openers and the two openers 5C and 5D are used as return openers. Alternatively, the functions of these openers may be switched. Specifically, the two openers 5C and 5D may be used as sending openers and the two openers 5A and 5B may be used as return openers. In this case, in FIGS. 13A and 13B, the FOUPs F1 and F2 are respectively transported to the return openers 5A and 5B, and substrates W are sequentially taken out therefrom.

(6) In the embodiment and the modifications described above, the two openers 5A and 5B are used as sending openers and the two openers 5C and 5D are used as return openers. In this regard, the four openers 5A to 5D may be used as sending openers and return openers.

In this case, after having transported all the substrates W for a FOUPs F placed on, for example, the opener 5A in the first opener line 9, the first substrate transportation mechanism 6A transports substrates W to another FOUP F placed on the opener 5B in the first opener line 9. After having transported all the substrates W in a FOUP F placed on the opener 5C in the second opener line 10, the second substrate transportation mechanism 6B transports substrates W for a FOUP F placed on the opener 5D in the second opener line 10.

Accordingly, after having transported all the substrates W in the FOUP, each of the first substrate transportation mechanism 6A and the second substrate transportation mechanism 6B can transport substrates W for another FOUP F.

(7) In the embodiment and the modifications described above, in FIG. 11, after the determination in step S03, the determination in step S04 is performed. In this regard, the determination in step S03 may be performed after the determination in step S04. In this case, as a result of the determination in step S04, if all the conditions are satisfied (YES), the process proceeds to step S06, whereas if all the conditions are not satisfied (NO), the process proceeds to step S03. As a result of the determination in step S03, if it is determined that substrates can be transported (YES), the process proceeds to step S07, whereas if it is determined that substrates cannot be transported (NO), the process proceeds to step S05. In the case of this variation, an arrow returned from step S08 may be returned to a state before step S04 in order to perform the determination in the order of step S04 and step S03.

(8) In the embodiment and the modifications described above, step S04 in FIG. 11 may be replaced by the following operation. If no FOUP F are placed on the four openers 5A to 5D and the empty FOUP shelves EB1 to EB4 (see FIG. 13A), the FOUP transportation mechanism 62 transports FOUPs F to all the two return openers 5C and 5D, and then transports a FOUP F to one of the two sending openers 5A and 5B (see FIGS. 13A to 13C).

The present invention may be embodied in other specific forms without departing from the spirit or essential attributes thereof and, accordingly, reference should be made to the appended claims, rather than to the foregoing specification, as indicating the scope of the invention.

What is claimed is:

1. An indexer apparatus that sends and receives substrates to/from carriers each capable of accommodating a plurality of substrates, the indexer apparatus comprising:

a first carrier platform line including two or more carrier platforms arranged in an upward/downward direction;

a second carrier platform line including two or more carrier platforms arranged in the upward/downward direction, the second carrier platform line being disposed at a side of the first carrier platform line in a horizontal direction;

a substrate buffer unit on which a plurality of substrates is placed;

a first substrate transportation mechanism that transports a substrate between the substrate buffer unit and a carrier of said carriers placed on each of the two or more carrier platforms in the first carrier platform line; and a second substrate transportation mechanism that transports a substrate between the substrate buffer unit and the carrier placed on each of the two or more carrier platforms in the second carrier platform line, each of the first substrate transportation mechanism and the second substrate transportation mechanism including a hand capable of moving forward and backward in the horizontal direction and configured to hold a substrate, and a lifting/lowering rotation driving unit that lifts and lowers the hand along a strut portion extending in the upward/downward direction and that rotates the hand about an axis extending along the strut portion, and a position of the lifting/lowering rotation driving unit in the horizontal direction being fixed, the substrate buffer unit being disposed between the first substrate transport mechanism and the second substrate transport mechanism and a treating block coupled to the indexer apparatus, and the substrate buffer unit including a buffer strut extending in a vertical direction, and a plurality of support plates configured to be supported by the buffer strut to extend in a direction from the buffer strut to the treating block and in a horizontal direction.

2. The indexer apparatus according to claim 1, wherein after the first substrate transportation mechanism transports every substrate on the carrier placed on a predetermined carrier platform in the first carrier platform line, the first substrate transportation mechanism transports a substrate on another carrier in the first carrier platform line, and after the second substrate transportation mechanism transports every substrate on the carrier placed on a predetermined carrier platform in the second carrier platform line, the second substrate transportation mechanism transports a substrate on another carrier in the second carrier platform line.

3. A substrate treating apparatus for performing a treatment on a substrate, the substrate treating apparatus comprising:

an indexer block that sends and receives substrate to/from carriers each capable of accommodating a plurality of substrates; and a treating block that performs a predetermined treatment on a substrate, the indexer block including
a first carrier platform line including two or more carrier platforms arranged in an upward/downward direction,
a second carrier platform line including two or more carrier platforms arranged in the upward/downward direction, the second carrier platform line being disposed at a side of the first carrier platform line in a horizontal direction,
a substrate buffer unit being used for transporting a substrate between the indexer block and the treating block, a plurality of substrates being disposed on the substrate buffer,
a first substrate transportation mechanism that transports a substrate between the substrate buffer unit and a carrier of said carriers placed on each of the two or more carrier platforms in the first carrier platform line, and
a second substrate transportation mechanism that transports a substrate between the substrate buffer unit and the carrier placed on each of the two or more carrier platforms in the second carrier platform line,
each of the first substrate transportation mechanism and the second substrate transportation mechanism including a hand capable of moving forward and backward in the horizontal direction and configured to hold a substrate, and a lifting/lowering rotation driving unit that lifts and lowers the hand along a strut portion extending in the upward/downward direction and that rotates the hand about an axis extending along the strut portion, and
a position of the lifting/lowering rotation driving unit in the horizontal direction being fixed,
the substrate buffer unit being disposed between the first substrate transport mechanism and the second substrate transport mechanism and the treating block coupled to the indexer block, and
the substrate buffer unit including a buffer strut extending in a vertical direction, and a plurality of support plates configured to be supported by the buffer strut to extend in a direction from the buffer strut to the treating block and in a horizontal direction.

4. The substrate treating apparatus according to claim 3, wherein
after the first substrate transportation mechanism takes every substrate from the carrier placed on a predetermined carrier platform in the first carrier platform line, the first substrate transportation mechanism takes a substrate from another carrier in the first carrier platform line, and
after the second substrate transportation mechanism accommodates every substrate in the carrier placed on a predetermined carrier platform in the second carrier platform line, the second substrate transportation mechanism accommodates a substrate in another carrier in the second carrier platform line.

5. The substrate treating apparatus according to claim 4, further comprising:
a carrier transportation mechanism disposed at a side opposite to the first substrate transportation mechanism and the second substrate transportation mechanism with the first carrier platform line and the second carrier platform line interposed therebetween, the carrier transportation mechanism being configured to transport the carrier, wherein
the carrier transportation mechanism replaces a carrier from which every substrate has been taken by the first substrate transportation mechanism, by another carrier accommodating a substrate, and replaces a carrier caused to accommodate every substrate by the second substrate transportation mechanism, by another carrier accommodating no substrates.

6. The substrate treating apparatus according to claim 5, further comprising:
an empty carrier shelf on which a carrier accommodating no substrates is allowed to be placed, wherein
in a case where the carrier is not placed on any of the two or more carrier platforms in the first carrier platform line, a case where the carrier is not placed on at least one of the two or more carrier platforms in the second carrier platform line, and a case where the carrier is not placed on the empty carrier shelf, the carrier transportation mechanism transports a specific carrier to one of the carrier platforms on which the carrier is not placed in the second carrier platform line,
the second substrate transportation mechanism takes a substrate from the specific carrier and then accommodates a treated substrate treated in the treating block in the specific carrier, and
the carrier transportation mechanism leaves the specific carrier at a placement position of the specific carrier from when every substrate is taken from the specific carrier by the second substrate transportation mechanism to when every treated substrate is accommodated in the specific carrier.

7. The substrate treating apparatus according to claim 3, wherein
the first substrate transportation mechanism, the second substrate transportation mechanism, and a third substrate transportation mechanism of the treating block perform substrate transportation while causing hands of the first substrate transportation mechanism, the second substrate transportation mechanism, and the third substrate transportation mechanism to enter the substrate buffer unit simultaneously.

8. The substrate treating apparatus according to claim 3, wherein
the treating block includes a plurality of treatment layers arranged in the upward/downward direction,
each of the plurality of treatment layers includes
a third substrate transportation mechanism for transporting a substrate,
a transportation space extending linearly in the horizontal direction such that the third substrate transportation mechanism moves in the transportation space,
a plurality of liquid treatment units being arranged along the transportation space, the plurality of liquid treatment units being arranged horizontally with respect to the transportation space and being configured to treat a substrate by supplying a treatment solution, and
the plurality of liquid treatment units are not overlaid on each other in a plurality of levels but are arranged in one level in each of the plurality of treatment layers.

9. A method for controlling an indexer apparatus including a substrate buffer unit on which a plurality of substrates is placed, a first substrate transportation mechanism, and a second substrate transportation mechanism, the indexer apparatus being configured to send and receive a substrate to/from carriers each capable of accommodating a plurality of substrates, the method comprising:
a first substrate transportation step of transporting a substrate by the first substrate transportation mechanism between the substrate buffer unit and a carrier of said carriers placed on each of two or more carrier platforms included in a first carrier platform line and arranged in an upward/downward direction; and a second substrate transportation step of transporting a substrate by the second substrate transportation mechanism between the substrate buffer unit and the carrier placed on each of two or more carrier platforms included in a second carrier platform line and arranged in the upward/downward direction, the second carrier platform line being disposed at a side of the first carrier platform line in a horizontal direction, and in the first substrate transportation step and the second substrate transportation step, each of the first substrate transportation mechanism and the second substrate transportation mechanism transporting a substrate with a position of a lifting/lowering rotation driving unit in the horizontal direction being fixed, by using a hand capable of moving forward and backward in the horizontal direction and the lifting/lowering rotation driving unit configured to lift and lower the hand along a strut portion extending in the upward/downward direction and to rotate the hand about an axis along the strut portion, the substrate buffer unit being disposed between the first substrate transport mechanism and the second substrate transport mechanism and a treating block coupled to the indexer apparatus, and the substrate buffer unit including a buffer strut extending in a vertical direction, and a plurality of support plates configured to be supported by the buffer strut to extend in a direction from the buffer strut to the treating block and in a horizontal direction.

10. A method for controlling a substrate treating apparatus including a treating block that performs a predetermined treatment on a substrate, and an indexer block that sends and receives a substrate to/from carriers each capable of accommodating a plurality of substrates, the indexer block including a first substrate transportation mechanism, a second substrate transportation mechanism, and a substrate buffer unit, the substrate buffer unit being used for transporting a substrate between the indexer block and the treating unit, a plurality of substrates being placed on the substrate buffer unit, the method comprising:

a first substrate transportation step of transporting a substrate by the first substrate transportation mechanism between the substrate buffer unit and a carrier of said carriers placed on each of two or more carrier platforms included in a first carrier platform line and arranged in an upward/downward direction; and a second substrate transportation step of transporting a substrate by the second substrate transportation mechanism between the substrate buffer unit and the carrier placed on each of two or more carrier platforms included in a second carrier platform line and arranged in the upward/downward direction, the second carrier platform line being disposed at a side of the first carrier platform line in a horizontal direction, and in the first substrate transportation step and the second substrate transportation step, each of the first substrate transportation mechanism and the second substrate transportation mechanism transporting a substrate with a position of a lifting/lowering rotation driving unit in the horizontal direction being fixed, by using a hand capable of moving forward and backward in the horizontal direction and the lifting/lowering rotation driving unit configured to lift and lower the hand along a strut portion extending in the upward/downward direction and to rotate the hand about an axis along the strut portion, the substrate buffer unit being disposed between the first substrate transport mechanism and the second substrate transport mechanism and the treating block coupled to the indexer block, and the substrate buffer unit including a buffer strut extending in a vertical direction, and a plurality of support plates configured to be supported by the buffer strut to extend in a direction from the buffer strut to the treating block and in a horizontal direction.

11. The substrate treating apparatus according to claim 1, wherein each of the support plates is configured to such that a horizontal width thereof perpendicular to a direction toward the treating block is inserted into two divided tip-shaped portions of hands of a third substrate transportation mechanism in the treating block.

12. The method for controlling the substrate treating apparatus according to claim 10, further comprising:

a transporting step of transporting a specific carrier to one of the carrier platforms on which the carrier is not placed in the second carrier platform line by a carrier transportation mechanism in a case where the carrier is not placed on any of the two or more carrier platforms in the first carrier platform line, a case where the carrier is not placed on at least one of the two or more carrier platforms in the second carrier platform line, and a case where the carrier is not placed on an empty carrier shelf;

a taking and accommodating step of taking a substrate from the specific carrier and then accommodating a treated substrate treated in the treating block in the specific carrier by the second substrate transportation mechanism; and a leaving step of leaving the specific carrier at a placement position of the specific carrier by the carrier transportation mechanism from when every substrate is taken from the specific carrier by the second substrate transportation mechanism to when every treated substrate is accommodated in the specific carrier, wherein the substrate treating apparatus further includes the empty carrier shelf on which a carrier accommodating no substrates is allowed to be placed.

13. The method for controlling the substrate treating apparatus according to claim 10, wherein the first substrate transportation mechanism, the second substrate transportation mechanism, and a third substrate transportation mechanism of the treating block perform substrate transportation while causing hands of the first substrate transportation mechanism, the second substrate transportation mechanism, and the third substrate transportation mechanism to enter the substrate buffer unit simultaneously.

* * * * *